United States Patent
Moon et al.

(10) Patent No.: US 12,381,593 B2
(45) Date of Patent: Aug. 5, 2025

(54) TRANSMITTER CIRCUIT AND RECEIVER CIRCUIT OF INTERFACE CIRCUIT AND OPERATING METHOD THEREOF

(71) Applicant: Samsung Electronics Co., Ltd., Suwon-si (KR)

(72) Inventors: Byongmo Moon, Suwon-si (KR); Taeryeong Kim, Seoul (KR); Seongook Jung, Seoul (KR); Jeonghyeok You, Seoul (KR)

(73) Assignees: SAMSUNG ELECTRONICS CO., LTD.; UIF (University Industry Foundation), Yonsei University

( * ) Notice: Subject to any disclaimer, the term of this patent is extended or adjusted under 35 U.S.C. 154(b) by 159 days.

(21) Appl. No.: 18/105,815

(22) Filed: Feb. 4, 2023

(65) Prior Publication Data

US 2023/0361804 A1 Nov. 9, 2023

(30) Foreign Application Priority Data

May 3, 2022 (KR) .................. 10-2022-0054904
Jun. 21, 2022 (KR) .................. 10-2022-0075833

(51) Int. Cl.
*H04B 1/40* (2015.01)
*H03K 3/037* (2006.01)
(Continued)

(52) U.S. Cl.
CPC .............. *H04B 1/40* (2013.01); *H03K 3/037* (2013.01); *H03K 5/14* (2013.01); *H03K 5/2472* (2013.01);
(Continued)

(58) Field of Classification Search
CPC ... H03K 3/03; H03K 5/13; H03K 5/14; H04B 1/40; H03M 9/00
See application file for complete search history.

(56) References Cited

U.S. PATENT DOCUMENTS

| | | | |
|---|---|---|---|
| 8,638,870 B2 | 1/2014 | Sutivong et al. | |
| 8,718,037 B2 | 5/2014 | Ko et al. | |
| 9,310,830 B2* | 4/2016 | Fiedler | H03K 19/018521 |
| 9,947,378 B2 | 4/2018 | Lee et al. | |

(Continued)

FOREIGN PATENT DOCUMENTS

CN 103491038 A 1/2014

OTHER PUBLICATIONS

Il-Min Yi et al., "A 40-mV-Swing Single-Ended Transceiver for TSV with a Switched-Diode RX Termination," IEEE Transactions on Circuit and System-II:Express Briefs, vol. 61, No. 12, Dec. 2014.

(Continued)

*Primary Examiner* — Patrick C Chen
(74) *Attorney, Agent, or Firm* — Muir Patent Law, PLLC

(57) ABSTRACT

A transmitter circuit of an interface circuit includes a clock generating circuit, a pulse generating circuit, an overlapped multiplexing circuit, and an output circuit. The clock generating circuit generates a plurality of clocks having different phases. The pulse generating circuit generates a plurality of pulses based on the plurality of clocks. The overlapped multiplexing circuit receives a plurality of input signals in parallel, and sequentially outputs a plurality of overlapped signals based on the plurality of clocks, the plurality of input signals, and the plurality of pulses, and each overlapped signal includes bit values of two input signals among the plurality of input signals. The output circuit serially outputs bit values of the plurality of input signals in series based on the plurality of overlapped signal.

20 Claims, 19 Drawing Sheets

(51) Int. Cl.
*H03K 5/00* (2006.01)
*H03K 5/14* (2014.01)
*H03K 5/24* (2006.01)
*H03K 19/20* (2006.01)

(52) U.S. Cl.
CPC ... *H03K 19/20* (2013.01); *H03K 2005/00078* (2013.01)

(56) References Cited

U.S. PATENT DOCUMENTS

| | | | |
|---|---|---|---|
| 2009/0273493 A1* | 11/2009 | Kim | H03M 9/00 341/101 |
| 2016/0233867 A1* | 8/2016 | Tamura | H03K 21/026 |
| 2021/0225423 A1 | 7/2021 | Moon et al. | |

OTHER PUBLICATIONS

J. C. Lee et al, "A 1.2V 64Gb 8-Channel 256GB/s HBM DRAM with Peripheral-Base-Die Architecture and Small-Swing Technique on Heavy Load Interface," IEEE ISSCC Dig. Tech. Papers, Feb. 2016, pp. 318-320.

J.-Y. Kim et al., "A 0.166 pJ/b/pF, 3.5-5 Gb/s TSV I/O Interface with VOH Drift Control," in IEEE Transactions on Circuits and Systems II: Express Briefs, vol. 68, No. 6, Jun. 2021.

Y. Liu et al., "A Compact Low-Power 3D I/O in 45nm CMOS," in IEEE Int. Solid-State Circuits Conf. (ISSCC) Dig. Tech. Papers, Feb. 2012, pp. 142-144.

Y.-H. Song et al., "A 0.47-0.66 pJ/bit, 4.8-8 Gb/s I/O transceiver in 65 nm CMOS," IEEE J. Solid-State Circuits, vol. 48, No. 5, pp. 1276-1289, May 2013.

* cited by examiner

TRANSMITTER CIRCUIT AND RECEIVER CIRCUIT OF INTERFACE CIRCUIT AND OPERATING METHOD THEREOF

CROSS-REFERENCE TO RELATED APPLICATIONS

This application claims priority under 35 U.S.C. § 119 to Korean Patent Application Nos. 10-2022-0054904, filed on May 3, 2022, and 10-2022-0075833, filed on Jun. 21, 2022, in the Korean Intellectual Property Office, the disclosure of each of which is incorporated herein by reference herein in its entirety.

BACKGROUND

1. Field

The disclosure relates to a transmitter circuit and a receiver circuit of an interface circuit, and an operation method thereof.

2. Description of the Related Art

In order to increase integration of a semiconductor memory, a technology of stacking memory dies as a three-dimensional stacking structure is being researched. The dies of the memory with the three-dimensional stacking structure may be interconnected by using an electrical connection called through-silicon via (TSV). The dies of the memory may send and receive inter-die signals through the TSV, or may be connected to power supply voltage or ground voltage. However, when the TSV is used, a ratio of power consumption required for signal transmission in the entire power consumption may increase. Accordingly, there is a need for a method of reducing the power consumed during data signal input and output.

SUMMARY

Some embodiments may provide a transmitter circuit and a receiver circuit of an interface circuit and an operation method thereof, for reducing power consumed during data signal input and output.

According to some embodiments, a transmitter circuit includes a clock generating circuit, a pulse generating circuit, an overlapped multiplexing circuit, and an output circuit. The clock generating circuit may generate a plurality of clocks having different phases, and the pulse generating circuit may generate a plurality of pulses based on the plurality of clocks. The overlapped multiplexing circuit may receive a plurality of input signals in parallel, and sequentially output a plurality of overlapped signals based on the plurality of clocks, the plurality of input signals, and the plurality of pulses. Each of the plurality of overlapped signals may include bit values of two input signals among the plurality of input signals. The output circuit may output bit values of the plurality of input signals in series based on the plurality of overlapped signals.

According to some embodiments, a receiver circuit includes a plurality of comparators and a plurality of latches respectively connected to the plurality of comparators. The plurality of comparators may receive an input signal including a plurality of bits from a transmitter circuit. Each of the plurality of comparators may decide a bit value of a corresponding bit among the plurality of bits based on a corresponding clock among a plurality of clocks having different phases and output the decided bit value. A first comparator among the plurality of comparators may decide the bit value of the corresponding bit based on a first clock among the plurality of clocks and an output of a second comparator among the plurality of comparators, and transfer the decided bit value to a third comparator among the plurality of comparators.

According to some embodiments, an operation method of an interface circuit may be provided. The operation method may include receiving a plurality of input signals in parallel, sequentially generating a plurality of overlapped signals from the plurality of input signals based on a plurality of first clocks having different phases, and transmitting bit values of the plurality of input signal in series based on the plurality of overlapped signals. Each of the plurality of overlapped signals may include bit values of two input signals among the plurality of input signals.

DETAILED DESCRIPTION OF THE EMBODIMENTS

Figure 1:
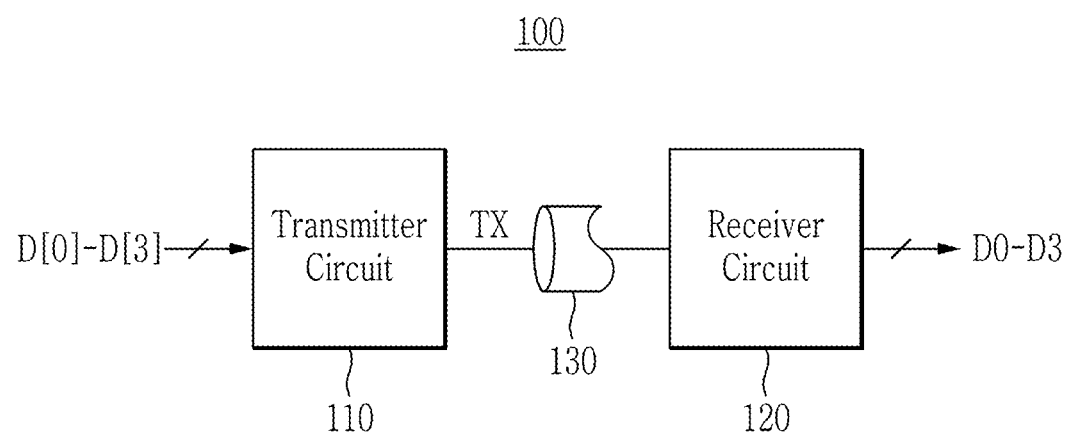
FIG. 1 is a block diagram showing an example of an interface circuit according to an embodiment.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

FIG. 1 is a block diagram showing an example of an interface circuit according to an embodiment.

Referring to FIG. 1, an interface circuit 100 may include a transmitter circuit 110, a receiver circuit 120, and a via 130. In some embodiments, the interface circuit 100 may be an interface circuit used for input and output of a memory device. The transmitter circuit 110 and the receiver circuit 120 may be connected through the via 130. In some embodiments, the via may be a through-substrate via (e.g., through-silicon via (TSV)).

The transmitter circuit 110 may receive input signals to be transmitted D[0], D[1], D[2], and D[3] in parallel. Each of the input signals D[0], D[1], D[2], and D[3] may correspond to one bit. Hereinafter, embodiments in which the transmitter circuit 110 receives the four input signals D[0], D[1], D[2], and D[3] in parallel are described, but the parallel input signals D[0], D[1], D[2], and D[3] are not limited thereto. The transmitter circuit 110 may generate an overlapped signal by binding bit values of the two input signals, and may output 1-bit value based on the two overlapped signals. For example, the transmitter circuit 110 receives eight or sixteen input signals in parallel. Through this process, the transmitter circuit 110 may serialize bit values of the parallel input signals D[0], D[1], D[2], and D[3], and transmit them as a transmission signal TX.

The receiver circuit 120 may receive the transmission signal TX through the via 130, and sequentially determine bit values D0, D1, D2, and D3 of the transmission signal TX to output the bit values D0, D1, D2, and D3 of the input signals D[0], D[1], D[2], and D[3].

In some embodiments, the interface circuit 100 may be an interface circuit for data transmission of a memory device, for example, a dynamic random-access memory (DRAM). In some embodiments, the interface circuit 100 may be an interface circuit used for a high bandwidth memory (HBM).

Figure 2:
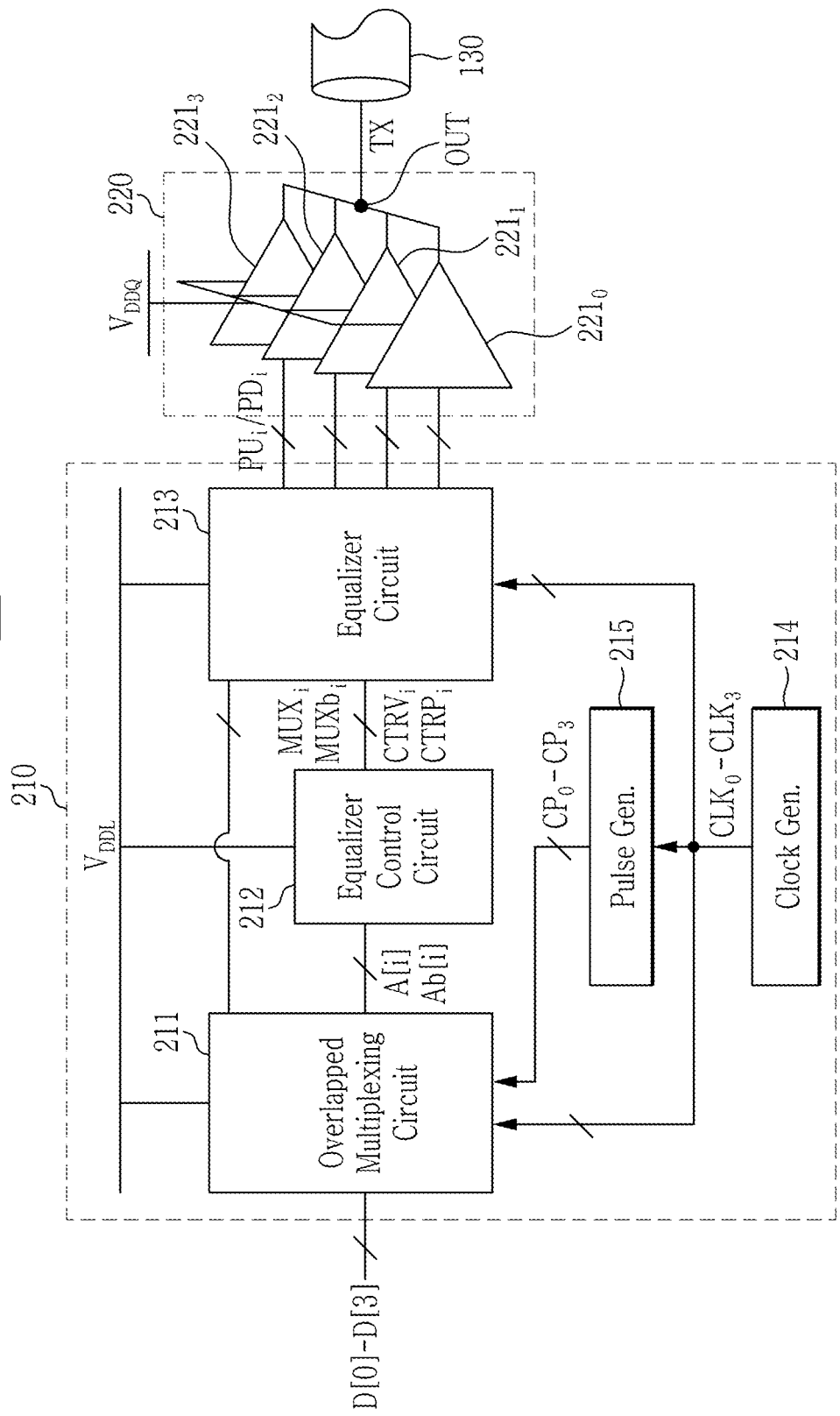
FIG. 2 is a block diagram showing an example of a transmitter circuit according to an embodiment.
Figure 3:
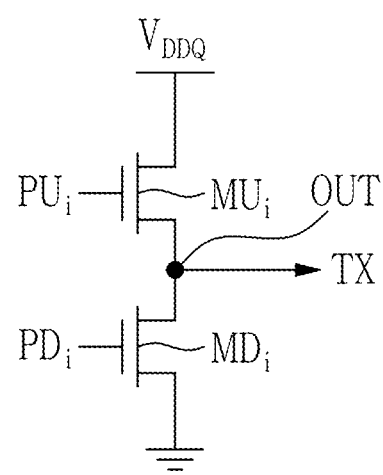
FIG. 3 is a circuit diagram showing an example of an output driver in a transmitter circuit according to an embodiment.
Figure 4:
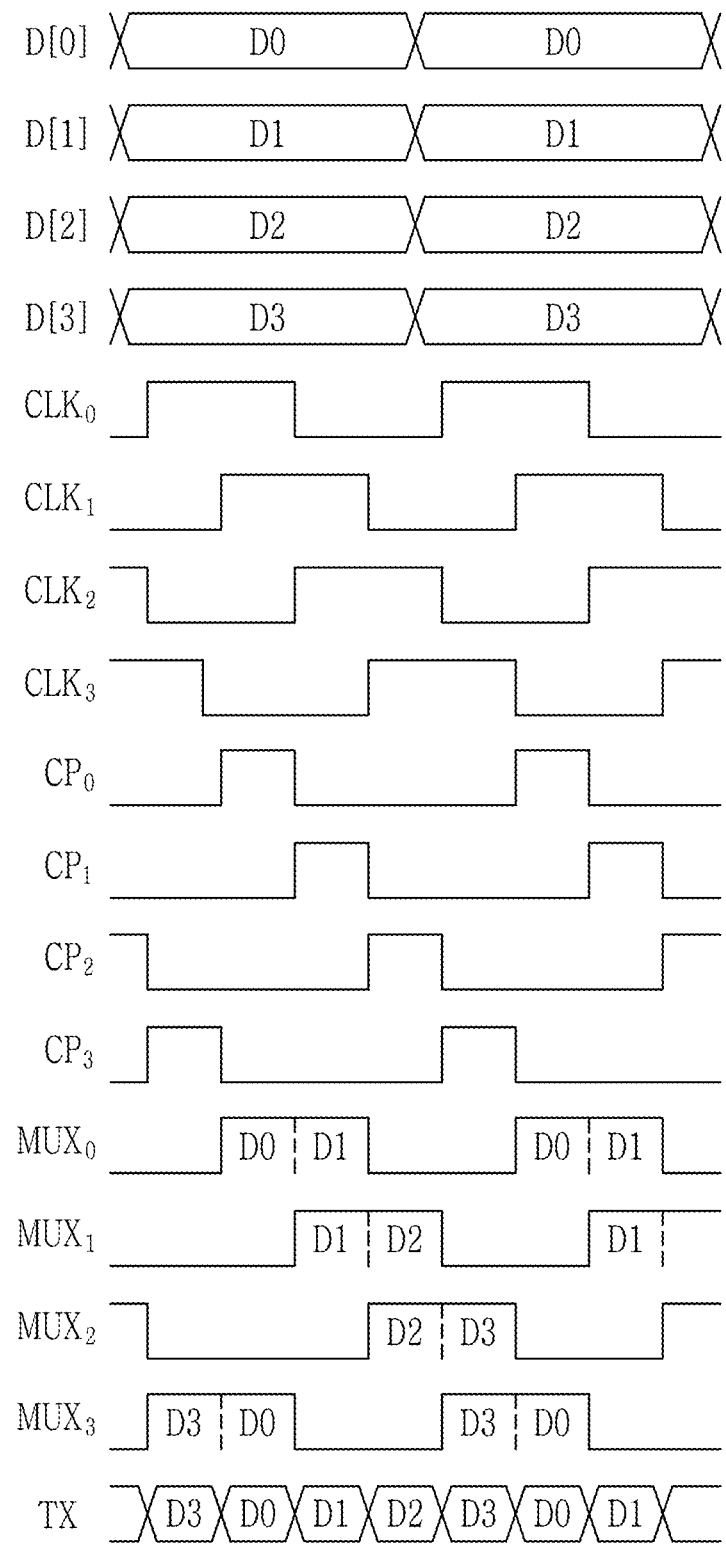
FIG. 4 is a timing diagram showing an example of signal timings in a transmitter circuit according to an embodiment.

FIG. 2 is a block diagram showing an example of a transmitter circuit according to an embodiment, FIG. 3 is a circuit diagram showing an example of an output driver in a transmitter circuit according to an embodiment, and FIG. 4 is a timing diagram showing an example of signal timings in a transmitter circuit according to an embodiment.

Referring to FIG. 2, a transmitter circuit 200 may include an overlapping circuit 210 and an output circuit 220. Herein, the transmitter circuit 200 may correspond to the transmitter circuit 110 of FIG. 1. The overlapping circuit 210 may include an overlapped multiplexing circuit 211, a clock generating circuit 214, and a pulse generating circuit 215.

Referring to FIGS. 2 and 4, the clock generating circuit 214 may generate a plurality of clocks $CLK_0$, $CLK_1$, $CLK_2$, and $CLK_3$ having different phases. When the transmitter circuit 200 receives four input signals D[0], D[1], D[2], and D[3] in parallel as a parallel input signal, the clock generating circuit 214 may generate the four clocks $CLK_0$, $CLK_1$, $CLK_2$, and $CLK_3$ having different phases. In FIG. 4, bit values of the input signals D[0], D[1], D[2], and D[3] are denoted as D0, D1, D2 and D3, respectively. The four clocks $CLK_0$, $CLK_1$, $CLK_2$, and $CLK_3$ may be clocks whose phases are shifted by 90°. The clock $CLK_1$ may be phase-shifted by 90° from the clock $CLK_0$, the clock $CLK_2$ may be phase-shifted by 90° from the clock $CLK_1$, and the clock $CLK_3$ may be phase-shifted by 90° from the clock $CLK_2$. Power consumption can be reduced by using the clocks having different phases instead of using a fast clock with high power consumption as described above.

The pulse generating circuit 215 may generate four pulses $CP_0$, $CP_1$, $CP_2$, and $CP_3$ in response to the four clocks $CLK_0$, $CLK_1$, $CLK_2$, and $CLK_3$, respectively. In some embodiments, as shown in FIG. 4, the pulse generating circuit 215 may generate the pulse $CP_0$ having a predetermined width based on the clocks $CLK_0$ and $CLK_1$, generate the pulse CP1 having the predetermined width based on the clocks $CLK_1$ and $CLK_2$, generate the pulse $CP_2$ having the predetermined width based on the clocks $CLK_2$ and $CLK_3$, and generate the pulse $CP_3$ having the predetermined width based on the clocks $CLK_3$ and $CLK_0$. In some embodiments, the predetermined width may correspond to a unit interval (UI). In some embodiments, the pulse generating circuit 215 may generate the pulse $CP_i$ having an active level (e.g., a high level) during a period in which the two clocks CLKi and $CLK_{i+1}$ have the active level. For example, the pulse generating circuit 215 may generate the pulse $CP_i$ by performing an AND operation on the two clocks $CLK_i$ and $CLK_{i+1}$. Here, i is an integer between 0 and 3. Hereinafter, when an index (i+n) is greater than 3 (n is an integer), the index (i+n) may be interpreted into an index ((i+n) mod 4) of input signals input after current input signals (or input signals at a next timing). Further, when an index (i+n) is less than 0, the index (i+n) may be interpreted as an index ((i+n) mod 4) of input signals inputted before the current input signals (or input signals at a previous timing).

The overlapped multiplexing circuit 211 may receive the input signals D[0], D[1], D[2], and D[3] in parallel, and sequentially output overlapped signals $MUX_0$, $MUX_1$, $MUX_2$, and $MUX_3$ based on the input signals D[0], D[1], D[2], and D[3], the clocks $CLK_0$-$CLK_3$, and the pulses $CP_0$-$CP_3$. Each overlapped signal $MUX_i$ may include bit values of two adjacent input signals D[i] and D[i+1]. That is, the overlapped multiplexing circuit 211 may output the overlapped signal $MUX_0$ by overlapping the two input signals D[0] and D[1], output the overlapped signal $MUX_1$ by overlapping the two input signals D[1] and D[2], output the overlapped signal $MUX_2$ by overlapping the two input signals D[2] and D[3], and output the overlapped signal $MUX_3$ by overlapping the two input signals D[3] and D[0]. In this case, the input signal D[0] included in the overlapped signal $MUX_3$ may be an input signal D[0] inputted at the next timing. In some embodiments, the overlapped multiplexing circuit 211 may further output complementary overlapped signals $MUXb_0$, $MUXb_1$, $MUXb_2$, and $MUXb_3$ that have complementary values of the bit values of the overlapped signals $MUX_0$, $MUX_1$, $MUX_2$, and $MUX_3$, respectively.

In some embodiments, the overlapping circuit 210 may further include an equalizer control circuit 212 and an equalizer circuit 213. The equalizer control circuit 212 may generate a control signal for controlling an operation of the equalizer circuit 213 based on the signals generated by the overlapped multiplexing circuit 211 and the pulses $CP_0$-$CP_3$. The equalizer circuit 213 may perform voltage equalization and phase equalization on the overlapped signal $MUX_i$ and the complementary overlapped signal $MUXb_1$ based on the control signal from the equalizer control circuit 212 and the clock $CLK_i$ to output equalized signals, for example, a pull-up signal $PU_i$ and a pull-down signal $PD_i$. The pull-up signal $PU_i$ and the pull-down signal $PD_i$ may have the same levels as the overlapped signals $MUX_i$ and the complementary overlapped signal $MUXb_i$, respectively.

The output circuit 220 may include a plurality of output drivers $221_0$, $221_1$, $221_2$, and $221_3$ that correspond to the input signals D[0], D[1], D[2], and D[3], respectively. Outputs of the output drivers $221_0$-$221_3$ may be commonly connected to an output node OUT, and the output node OUT may be connected to a receiver circuit (e.g., 120 in FIG. 1) through a via 130. Each output driver $221_i$ may output a transmission signal TX at the output node OUT based on corresponding overlapped signal $MUX_i$ and complementary overlapped signal $MUXb_i$ among the overlapped signals $MUX_0$-$MUX_3$ and the complementary overlapped signals $MUXb_0$-$MUXb_3$. In some embodiments, each output driver $221_i$ may receive the pull-up and pull-down signals $PU_i$ and $PD_i$ into which the corresponding overlapped signal $MUX_i$ and complementary overlapped signal $MUXb_i$ are equalized by the equalizer circuit 213, and output the transmission signal TX at the output node OUT based on the pull-up and pull-down signals $PU_i$ and $PD_i$. Each output driver $221_i$ may sequentially output the bit value $D_i$ of the corresponding input signal and the bit value $D_{i+1}$ of the next input signal to the output node OUT in response to the pull-up and pull-down signals $PU_i$ and $PD_i$. In this way, the bit value Di of each input signal may be transmitted to the output node OUT through the corresponding output driver $221_i$ and the previous output driver $221_{i-1}$ so that an area of the output driver $221_i$ may be reduced. Accordingly, the output circuit 220 may generate the transmission signal TX into which the bit values D0, D1, D2, and D3 of the input signals D[0], D[1], D[2], and D[3] are serialized.

In some embodiments, each output driver $221_i$ may be implemented as an NN driver. In some embodiments, as shown in FIG. 3, each output driver $221_i$ may include a pull-up transistor $MU_i$ connected between a power supply $V_{DDQ}$ and the output node OUT and a pull-down transistor $MD_i$ connected between the output node OUT and a ground terminal. The transistors $MU_i$ and $MD_i$ may be metal oxide semiconductor (MOS) transistors, particularly NMOS transistors. The transistors $MU_i$ and $MD_i$ may each have a source, a drain and a gate as a first input terminal, a second input terminal, and a control terminal, respectively. The pull-up signal $PU_i$ may be inputted to the gate of the pull-up transistor $MU_i$, and the pull-down signal $PD_i$ may be inputted to the gate of the pull-down transistor $MD_i$. Therefore, any one of the pull-up transistor $MU_i$ and the pull-down transistor $MD_i$ may operate in response to the bit value of the overlapped signal $MUX_i$, and the other may operate in response to the complementary bit value of the overlapped signal $MUX_i$ (or the bit value of the complementary overlapped signal $MUXb_i$). For example, when the bit value of the overlapped signal $MUX_i$ is '1', the pull-up transistor $MU_i$ may be turned on in response to the pull-up signal $PU_i$ and the output node OUT may have a high level. When the bit value of the overlapped signal MUXi is '0', the pull-down transistor $MD_i$ may be turned on in response to the pull-down signal $PD_i$ and the output node OUT may have a low level.

In some embodiments, in order to reduce the power consumption in the signal transmission process through the via 130, the output circuit 220 may use a power supply voltage $V_{DDQ}$ lower than a power supply voltage $V_{DDL}$ of the overlapping circuit 210. In some embodiments, the power supply voltage $V_{DDL}$ may be 0.7 V and the power supply voltage $V_{DDQ}$ may be 0.2 V. The output circuit 220 may relieve frequency constraints caused by the power supply voltage $V_{DDQ}$ and the high data rate, by using the output drivers $221_0$-$221_3$ connected in a 4-to-1 multiplexing structure. Further, since the bit value $D_i$ of each input signal is transmitted to the output node OUT through the two output drivers $221_{i-1}$ and $221_i$, the area of the output driver $221_i$ may be reduced. Herein, for convenience of description, the terms of the power supply voltage $V_{DDQ}$ and the power supply $V_{DDQ}$ may be used interchangeably.

Figure 5:
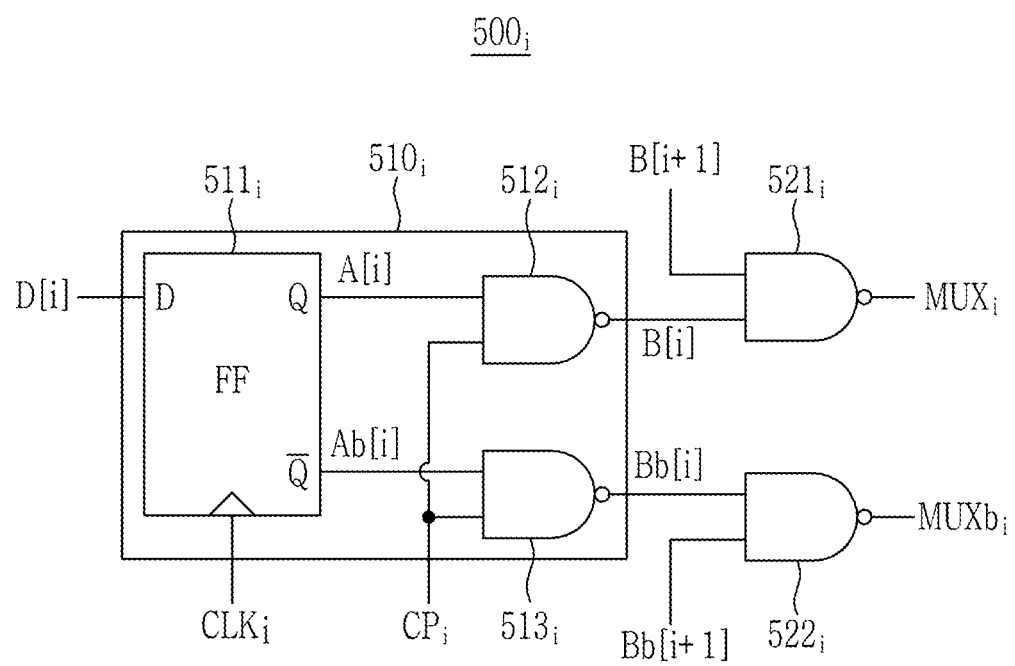
FIG. 5 is a circuit diagram showing an example of an overlapped multiplexing circuit in a transmitter circuit according to an embodiment.
Figure 6:
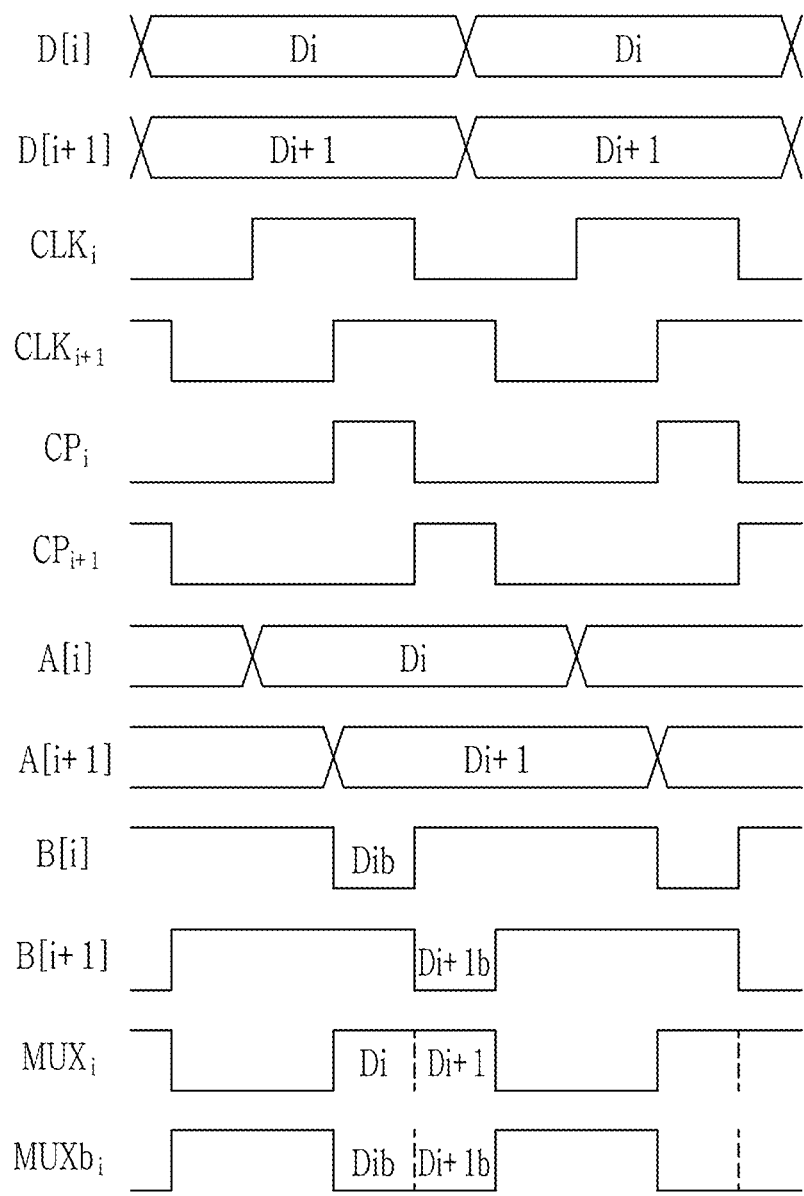
FIG. 6 is a timing diagram showing an example of signal timings in an overlapped multiplexing circuit shown in FIG. 5 according to an embodiment.

FIG. 5 is a circuit diagram showing an example of an overlapped multiplexing circuit in a transmitter circuit according to an embodiment, and FIG. 6 is a timing diagram showing an example of signal timings in an overlapped multiplexing circuit shown in FIG. 5 according to an embodiment.

Referring to FIG. 5, an overlapped multiplexing circuit $500_i$ may include a multiplexing circuit $510_i$ and an overlapped circuit 5211 corresponding to an input signal D[i] having an index i. Each multiplexing circuit $510_i$ may include a delay circuit $511_i$ and a logic circuit $512_i$, and may receive a corresponding input signal D[i] among a plurality of input signals D[0], D[1], D[2], and D[3], a corresponding clock $CLK_i$ among a plurality of clocks $CLK_0$-$CLK_3$, and a corresponding pulse $CP_i$ among a plurality of pulses $CP_0$-$CP_3$. In some embodiments, the transmitter circuit 110 or 200 may include a plurality of overlapped multiplexing circuits $500_i$ that correspond to the plurality of input signals D[0], D[1], D[2], and D[3], respectively. For example, the plurality of overlapped multiplexing circuits $500_i$ may correspond to the overlapped multiplexing circuit 211 of FIG. 2.

Referring to FIG. 5 and FIG. 6, the delay circuit $511_i$ may delay the corresponding input signal D[i] by a period corresponding to a 90*i° phase difference and output a delayed signal A[i], in response to an active edge (e.g., a rising edge) of the corresponding clock $CLK_i$. The clock $CLK_i$ inputted to the delay circuit $511_i$ may be a clock whose phase is shifted by 90*i° with respect to the clock $CLK_0$. In some embodiments, the delay circuit $511_i$ may output the delayed signal A[i] by capturing the input signal D[i] in response to the active edge of the corresponding clock $CLK_i$ and maintaining the captured input signal D[i]. In some embodiments, the delay circuit $511_i$ may include a flip-flop, for example, a D flip-flop. In this way, each delay circuit $511_i$ may output the delayed signal A[i] in response to the active edge of the clock $CLK_i$, so that a plurality of delay circuits $511_i$ may output a delayed signal A[i] and then output a next delayed signal A[i] after being delayed by a 90° phase of the clock. Accordingly, the plurality of delay circuits $511_i$ may sequentially output a plurality of delayed signals A[0], A[1], A[2], and A[3].

The logic circuit $512_i$ may perform a logical operation on the delayed signal A[i] and the corresponding pulse $CP_i$ to output a multiplexing output signal B[i] having a complementary value of a bit value $D_i$ of the input signal D[i]. The logic circuit $512_i$ may output the multiplexing output signal B[i] during a period in which the pulse $CP_i$ has a predetermined level, for example, a high level. In some embodiments, the logic circuit $512_i$ may be a NAND gate. Then, while the pulse $CP_i$ has the high level, the NAND gate $512_i$ may output the multiplexing output signal B[i] having '0' in a case of the delayed signal A[i] having '1', and output the multiplexing output signal B[i] having '1' in a case of the delayed signal A[i] having '0'. For convenience of description, FIG. 6 shows the multiplexing output signal B[i] having '0' is shown. In this way, a plurality of logic circuits $512_i$ may outputs the complementary input signal B[i] during a unit interval (UI) and then output a next complementary input signal B[i+1] during a next UI. Accordingly, the plurality of logic circuits $512_i$ may sequentially output complementary input signals B[0], B[1], B[2], and B[3].

The overlapped circuit $521_i$ may receive the multiplexing output signal B[i] from the corresponding logic circuit $512_i$, receive a next multiplexing output signal B[i+1] from a next logical circuit $512_{i+1}$, and output an overlapped signal $MUX_i$ by binding the two multiplexing output signals B[i] and B[i+1]. When receiving the complementary input signals B[i] and B[i+1], the overlapped circuit $521_i$ may output the overlapped signal $MUX_i$ by binding complementary signals of the two multiplexing output signals B[i] and B[i+1]. On the other hand, the overlapped circuit $521_3$ may receive the multiplexing output signal B[3] and the multiplexing output signal B[0] generated by parallel input signals at a next timing, and output the overlapped signal $MUX_3$ by binding the two multiplexing output signals B[3] and B[0]. In some embodiments, the overlapped circuit 5211 may include a logic circuit, for example, a NAND gate.

In some embodiments, the delay circuit $511_i$ may output a complementary delayed signal Ab[i] having a complementary bit value of the delayed signal A[i] together with the delayed signal A[i]. In this case, each multiplexing circuit $510_i$ may further include a logic circuit (e.g., a NAND gate) $513_i$ that performs a logical operation on the complementary delayed signal Ab[i] and the corresponding pulse $CP_i$ to output a complementary multiplexing output signal Bb[i] having the bit value Di of the input signal D[i]. In addition, the overlapped multiplexing circuit $500_i$ may further include an overlapped circuit $522_i$ that generates a complementary overlapped signal $MUXb_i$ by binding the complementary multiplexing output signal Bb[i] of the logic circuit $513_i$ and the complementary multiplexing output signal Bb[i+1] of a next logical circuit $513_{i+1}$. For example, the overlapped circuit 522i may output the complementary overlapped signal $MUXb_i$ having the complementary bit value of the overlapped signal $MUX_i$ of the overlapped circuit $521_i$.

In some embodiments, the output signal of the delay circuit $511_i$ may be inputted to an equalizer control circuit (e.g., 212 in FIG. 2).

Figure 7:
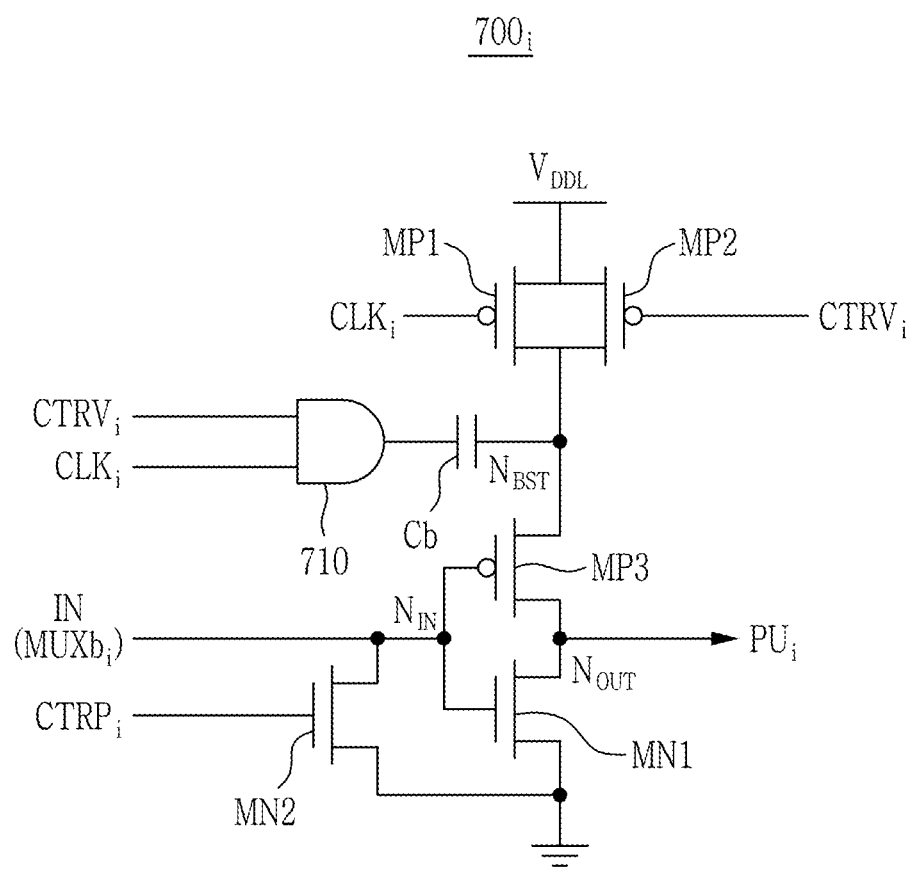
FIG. 7 is a circuit diagram showing an example of an equalizer circuit in a transmitter circuit according to an embodiment.

FIG. 7 is a circuit diagram showing an example of an equalizer circuit in a transmitter circuit according to an embodiment.

Referring to FIG. 7, an equalizer circuit $700_i$ may include a plurality of transistors MP1, MP2, MP3, MN1, and MN2, a capacitor Cb, and a logic circuit 710. In some embodiments, the transmitter circuit 110 or 200 may include a plurality of equalizer circuits $700_i$ that correspond to the plurality of input signals D[0], D[1], D[2], and D[3], respectively (or receive a plurality of overlapped signals, respectively). For example, the plurality of equalizer circuits $700_i$ may correspond to the equalizer circuit 213 of FIG. 2. FIG. 7 shows the equalizer circuit $700_i$ corresponding to an input signal D[i]. The equalizer circuit $700_i$ may receive an overlapped signal $MUXb_i$, a clock $CLK_i$, a voltage control signal $CTRV_i$, and a phase control signal $CTRP_i$, and perform voltage equalization and phase equalization on the complementary overlapped signal $MUXb_i$. In some embodiments, the equalizer circuit $700_i$ may receive a complementary overlapped signal $MUXb_i$ in which an overlapped signal $MUX_i$ output from an overlapped multiplexing circuit (e.g., $500_1$ in FIG. 5) is inverted by an inverter (not shown). In some embodiments, the equalizer circuit 7001 may receive the complementary overlapped signal $MUXb_i$ output from the overlapped multiplexing circuit $500_i$ in FIG. 5.

In some embodiments, the transistors MP1, MP2, MP3, MN1, and MN2 may be MOS transistors. In some embodiments, the transistors MP1, MP2, and MP3 may be P-channel transistors, e.g., PMOS transistors, and the transistors MN1 and MN2 may be N-channel transistors, e.g., NMOS transistors. The transistors MP1, MP2, MP3, MN1, and MN2 may each have a source, a drain, and a gate as a first input terminal, a second input terminal, and a control terminal.

The transistors MP1 and MP2 may be connected in parallel between a power supply $V_{DDL}$ and a boost node (or a first node) $N_{BST}$. For example, the sources of the transistors MP1 and MP2 may be connected to the power supply $V_{DDL}$, and the drains of the transistors MP1 and MP2 may be connected to the boost node $N_{BST}$. A clock $CLK_i$ may be inputted to the gate of the transistor MP1, and a voltage control signal $CTRV_i$ may be inputted to the gate of the transistor MP2. The transistors MP3 and MN1 may be connected in series between the boost node $N_{BST}$ and a ground terminal, and the gates of the transistors MP3 and MN1 may be connected to an input node (or a second node) $N_{IN}$. For example, the source of the transistor MP3 may be connected to the boost node $N_{BST}$, the source of the transistor MN1 may be connected to the ground terminal, and the drain of transistor MP3 and the drain of transistor MN1 may be connected to an output node (or a third node) $N_{OUT}$. The transistors MP3 and MN1 may form an inverter. In this case, the gates of the transistors MP3 and MN1 may correspond to an input terminal of the inverter, and the drains of the transistors MP3 and MN1 may correspond to an output terminal of the inverter. For example, a complementary overlapped signal $MUXb_i$ outputted from the overlapped multiplexing circuit $500_i$ may be inputted to the input node $N_{IN}$ as an input signal IN, and the inverter formed by the transistors MP3 and MN1 may output a pull-up signal $PU_i$ in response to the complementary overlapped signal $MUXb_i$. In addition, an overlapped signal $MUX_i$ outputted from the overlapped multiplexing circuit $500_i$ may be inputted to the input node $N_{IN}$ as an input signal IN, and the inverter formed by the transistors MP3 and MN1 may output a pull-down signal $PD_i$ in response to the overlapped signal $MUX_i$. A signal into which the overlapped signal $MUX_i$ from the overlapped multiplexing circuit (e.g., $500_i$ of FIG. 5) is equalized may be outputted to the output node $N_{OUT}$. The transistor MN2 may be connected between the input node $N_{IN}$ and the ground terminal, and a phase control signal $CTRP_i$ may be inputted to the gate of the transistor MN2. For example, the source of the transistor MN2 may be connected to the ground terminal, and the drain of the transistor MN2 may be connected to the input node $N_{IN}$.

The logic circuit 710 may receive the clock $CLK_i$ and the voltage control signal $CTRV_i$ as inputs, and may perform a logical operation on the clock $CLK_i$ and the voltage control signal $CTRV_i$. In some embodiments, the logic circuit 710 may be an AND gate, and may perform an AND operation on the clock $CLK_i$ and the voltage control signal $CTRV_i$. The capacitor Cb may be connected between the output terminal of the logic circuit 710 and the boost node $N_{BST}$. The capacitor Cb may boost a voltage of the boost node $N_{BST}$ based on an output of the logic circuit 710.

In some embodiments, the equalizer circuit 7001 may be connected to a gate of a pull-up transistor (e.g., $MU_i$ in FIG. 3) of an output driver (e.g., $221_i$ in FIG. 3) corresponding to the input signal D[i]. In this case, the output of the equalizer circuit $700_i$ may be applied to the gate of the pull-up transistor $MU_i$ as a pull-up signal $PU_i$. In some embodiments, an equalizer circuit connected to a gate of a pull-down transistor (e.g., $MD_i$ in FIG. 3) of the output driver may be further provided. In this case, an output of the equalizer circuit may be applied to the gate of the pull-down transistor $MD_i$ as a pull-down signal (e.g., $PD_i$ in FIG. 3).

Figure 8A:
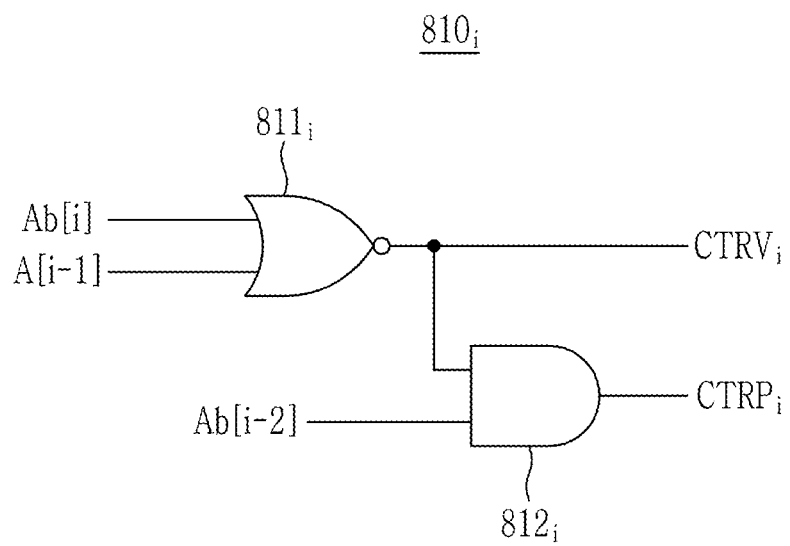
FIG. 8A and FIG. 8B are circuit diagrams of examples of an equalizer control circuit in a transmitter circuit according to an embodiment.
Figure 8B:
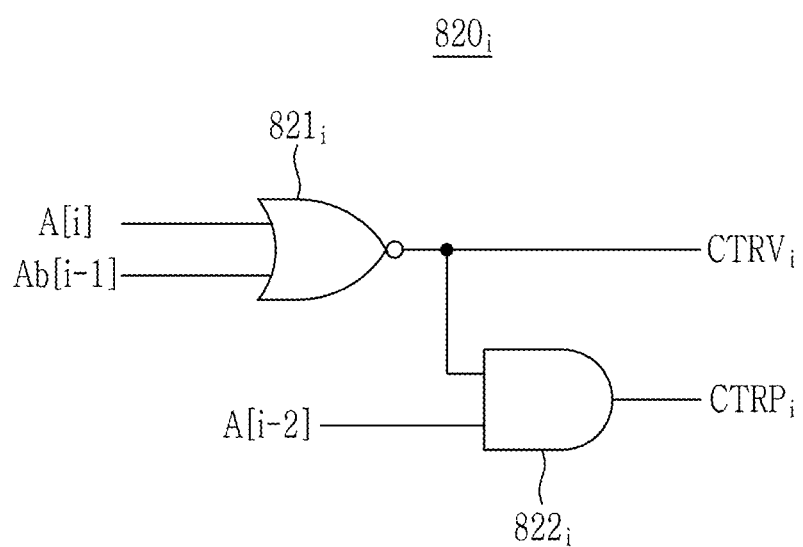

FIG. 8A and FIG. 8B are circuit diagrams of examples of an equalizer control circuit in a transmitter circuit according to an embodiment.

Referring to FIG. 8A and FIG. 8B, an equalizer control circuit $810_i$ may include logic circuits $811_i$ and $812_i$, and an equalizer control circuit $820_i$ may include logic circuits $821_i$ and $822_i$. In some embodiments, the transmitter circuit 110 or 200 may include a plurality of equalizer control circuits $810_i$ and a plurality of equalizer control circuits $820_i$. For example, the plurality of equalizer control circuits $810_i$ and $820_i$ may correspond to the equalizer control circuit 212 of FIG. 2. The equalizer control circuits $810_i$ and $820_i$ shown in FIG. 8A and FIG. 8B may correspond to an input signal D[i]. In some embodiments, the equalizer control circuit $810_i$ shown in FIG. 8A may generate a voltage control signal $CTRV_i$ and a phase control signal $CTRP_i$ for controlling an equalizer circuit connected to a pull-up transistor (e.g., $MU_i$ in FIG. 3) of an output driver (e.g., $221_i$ in FIG. 3). The equalizer control circuit $820_i$ shown in FIG. 8B may generate a voltage control signal $CTRV_i$ and a phase control signal $CTRP_i$ for controlling an equalizer circuit connected to a pull-down transistor (e.g., $MD_i$ in FIG. 3) of the output driver $221_i$.

Referring to FIG. 8A, the logic circuit $811_i$ may receive a delayed signal A[i−1] (e.g., an output of a delay circuit $511_{i-1}$ receiving an input signal D[i−1] like a delay circuit $511_i$ shown in FIG. 5) and a complementary delayed signal Ab[i] (e.g., a complementary output of the delay circuit $511_i$ shown in FIG. 5), and perform a logical operation on the delayed signal A[i−1] and the complementary delayed signal Ab[i] to output the voltage control signal $CTRV_i$ for controlling voltage equalization. In some embodiments, the logic circuit $811_i$ may be a NOR gate, and output the voltage control signal $CTRV_i$ by performing a NOR operation on the delayed signal A[i−1] and the complementary delayed signal Ab[i]. The logic circuit $812_i$ may receive the output $CTRV_i$ from the logic circuit $811_i$ and a complementary delayed signal Ab[i−2] (e.g., a complementary output of a delay circuit $511_{i-2}$ receiving an input signal D[i−2] like a delay circuit $511_i$ shown in FIG. 5), and perform a logical operation on the voltage control signal $CTRV_i$ and the complementary delayed signal Ab[i−2] to the phase control signal $CTRP_i$ for controlling phase equalization. In some embodiments, the logic circuit $812_i$ may be an AND gate, and output the phase control signal $CTRP_i$ by performing an AND operation on the voltage control signal $CTRV_i$ and the complementary delayed signal Ab[i−2].

Referring to FIG. 8B, the logic circuit $821_i$ may receive a complementary delayed signal Ab[i−1] (e.g., a complementary output of the delay circuit $511_{i-1}$) and a delayed signal A[i] (e.g., an output of the delay circuit $511_i$ shown in FIG. 5), and perform a logical operation on the complementary delayed signal Ab[i−1] and the delayed signal A[i] to output the voltage control signal $CTRV_i$. In some embodiments, the logic circuit $821_i$ may be a NOR gate. The logic circuit $822_i$ may receive an output $CTRV_i$ from the logic circuit $821_i$ and a delayed signal A[i−2] (e.g., an output of the delay circuit $511_{i-2}$), and perform a logical operation on the voltage control signal $CTRV_i$ and the delayed signal A[i−2] to output the phase control signal $CTRP_i$. In some embodiments, the logic circuit $822_i$ may be an AND gate.

Accordingly, when the input signals D[i−1] and D[i] have '0' and '1', respectively, the NOR gate $811_i$ may output the voltage control signal $CTRV_i$ having a high level. For example, the equalizer control circuit $810_i$ may detect the input signals D[i−1] and D[i] corresponding to "01" to output the voltage control signal $CTRV_i$ having a predetermined level (e.g., the high level). In addition, when the input signals D[i−2], D[i−1], and D[i] have '0', '0' and '1', respectively, the NOR gate $811_i$ may output the voltage control signal CTRVi having the high level, and the AND gate $812_i$ may output the phase control signal $CTRP_i$ having the high level. The equalizer control circuit $810_i$ may detect the input signals D[i−2], D[i−1], and D[i] corresponding to "001" to output the phase control signal $CTRP_i$ having the predetermined level (e.g., the high level). Further, the equalizer control circuit 8201 may detect the input signals D[i−1] and D[i] corresponding to "10" to output the voltage control signal $CTRV_i$ having the predetermined level, and detect the input signals D[i−2], D[i−1], and D[i] corresponding to "110" to output the phase control signal $CTRP_i$ having the predetermined level.

Next, operations of the equalizer circuit and equalizer control circuit shown in FIG. 7, FIG. 8A, and FIG. 8B are described with reference to FIG. 9 to FIG. 14.

First, a voltage equalization operation of the equalizer circuit is described with reference to FIG. 8A, FIG. 8B, FIG. 9, FIG. 10, and FIG. 11. It is assumed in FIG. 9 and FIG. 10, that parallel input signals D[1] and D[2] inputted to a transmitter circuit are '0' and '1', respectively.

Figure 9:
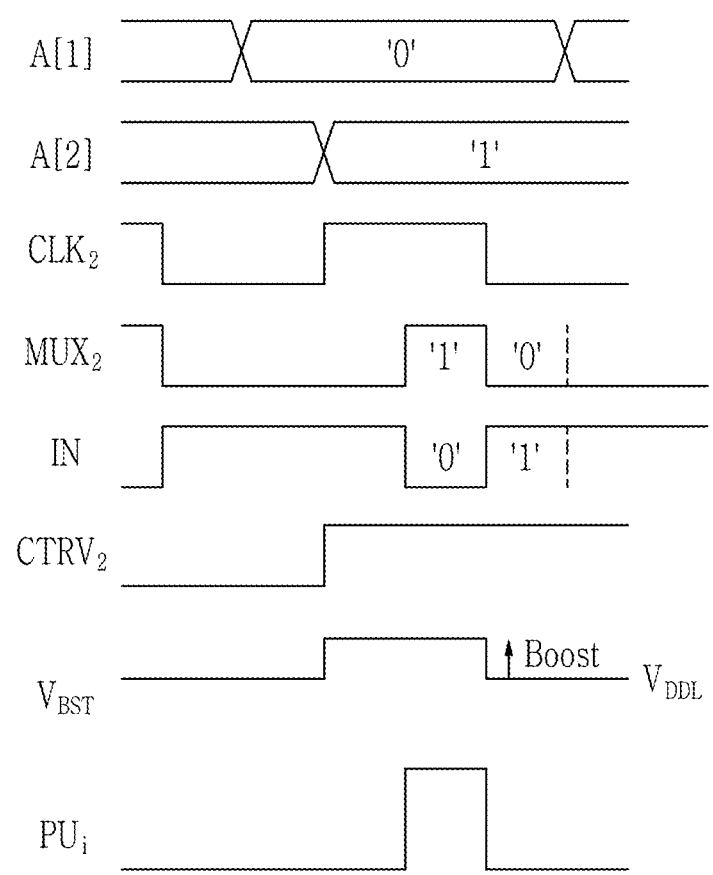
FIG. 9 is a timing diagram showing an example of signal timings in an equalizer circuit of a transmitter circuit according to an embodiment.
Figure 10:
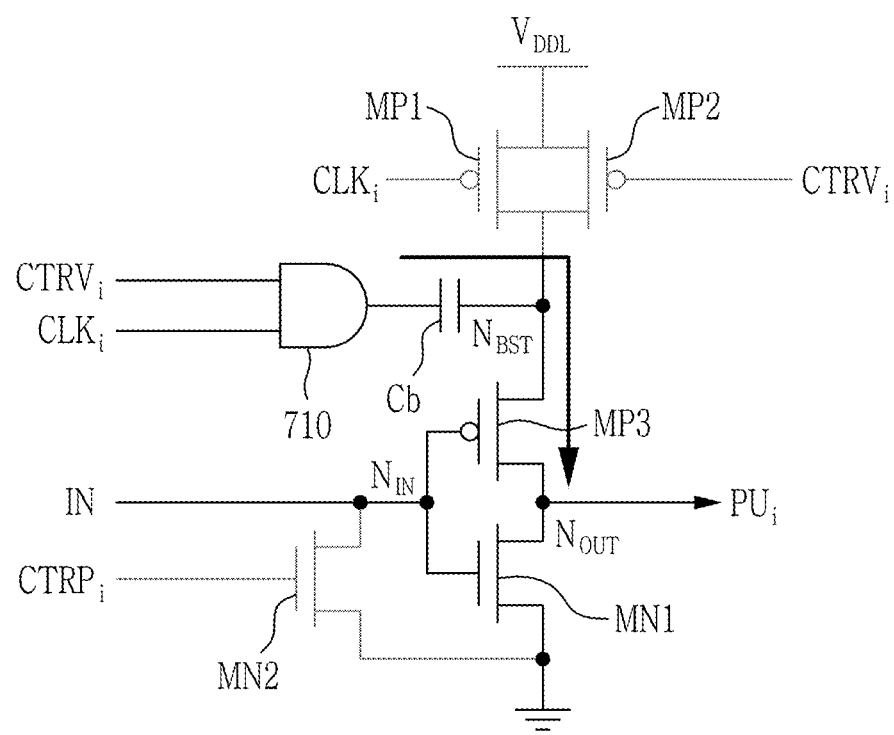
FIG. 10 is a circuit diagram showing an example case where an equalizer circuit performs voltage equalization in a transmitter circuit according to an embodiment.
Figure 11:
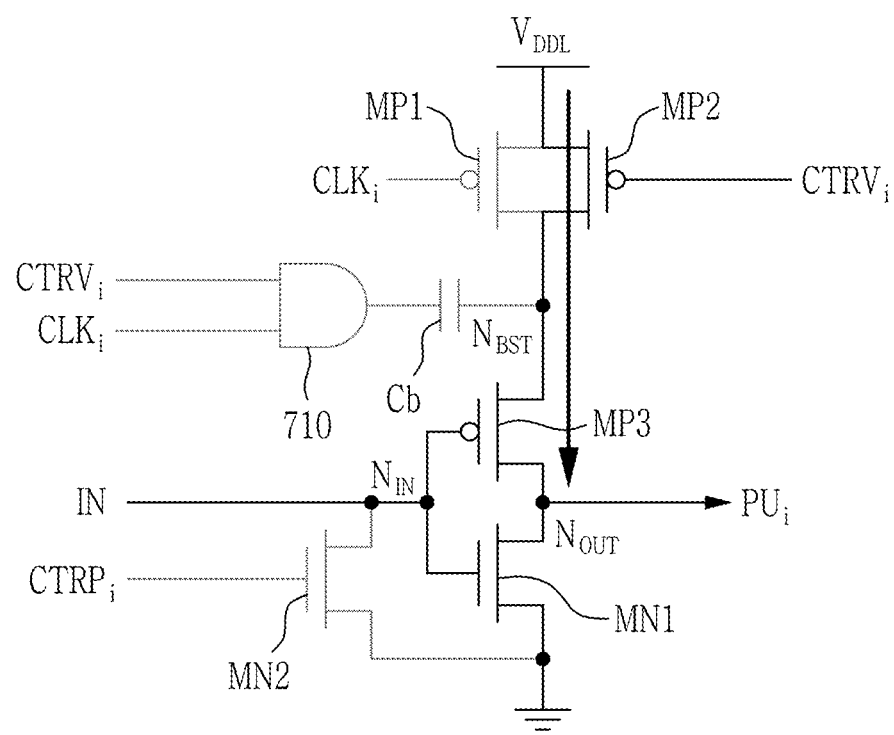
FIG. 11 is a circuit diagram showing an example case where an equalizer circuit does not perform voltage equalization in a transmitter circuit according to an embodiment.

FIG. 9 is a timing diagram showing an example of signal timings in an equalizer circuit of a transmitter circuit according to an embodiment, FIG. 10 is a circuit diagram showing an example case where an equalizer circuit performs voltage equalization in a transmitter circuit according to an embodiment, and FIG. 11 is a circuit diagram showing an example case where an equalizer circuit does not perform voltage equalization in a transmitter circuit according to an embodiment.

Referring to FIG. 8A and FIG. 9, in an equalizer control circuit $810_2$ corresponding to the input signal D[2], a logic circuit $811_2$ may output a voltage control signal $CTRV_2$ having a high level based on a complementary bit value '0' of a delayed signal A[2] and a bit value '0' of a delayed signal A[1].

Referring to FIG. 9 and FIG. 10, first, when an output of an AND gate 710 has a low level, and a clock $CLK_2$ or voltage control signal $CTRV_2$ has the low level, a capacitor Cb may be charged with a power supply voltage $V_{DDL}$ and a voltage $V_{BST}$ of a boost node $N_{BST}$ may become a voltage level of the power supply voltage $V_{DDL}$. Next, the AND gate 710 may output an output signal having the high level in response to the voltage control signal $CTRV_2$ having the high level and the clock $CLK_2$ having the high level. In this case, since the transistors MP1 and MP2 are turned off, a voltage $V_{BST}$ of a boost node $N_{BST}$ may be boosted from the power supply voltage $V_{DDL}$ by the output voltage of the AND gate 710. Next, when an overlapped signal $MUX_2$ has '1' in response to the bit value '1' of the input signal D[2], the input signal IN of the complementary overlapped signal $MUXb_2$ having the low level may be inputted to the input node $N_{IN}$. Then, the transistor MP3 is turned on and the boosted voltage may be outputted to an output node $N_{OUT}$ as the pull-up signal $PU_i$. For example, the voltage of the pull-up signal $PU_i$ may be boosted by voltage equalization.

As such, when the input signal is changed from '0' to '1', the equalizer circuit may perform the voltage equalization by outputting the boosted voltage of the pull-up signal $PU_i$. The boosted voltage of the pull-up signal $PU_i$ may be applied to a gate of a pull-up transistor (e.g., $MU_i$ in FIG. 3) of an output driver (e.g., 221$i$ in FIG. 3), and the pull-up transistor $MU_i$ of the output driver 221$_i$ may be turned on in response to the boosted voltage of the pull-up signal $PU_i$ and output a voltage having the high level to an output node OUT. Further, when the input signal is changed from '1' to '0', an equalizer circuit connected to a pull-down transistor (e.g., $MD_i$ in FIG. 3) of the output driver 221$_i$ may output the boosted voltage as a pull-down signal $PD_i$, and the pull-down transistor $MD_i$ of the output driver 221$_i$ may be turned on in response to the boosted voltage of the pull-down signal $PD_i$ and output a voltage having the low level on the output node OUT.

The above-described equalizer circuit, when a first input signal and a second input signal before the first input signal have different bit values (i.e., when a data transition of "01" or "10" occurs), may boost the gate voltage of the output driver 221$_i$, so that a voltage margin may be increased, and inter-symbol interference (ISI) caused by the data transition may be improved. Further, since the equalizer circuit does not shift an entire level when boosting the gate voltage, the equalizer circuit may reduce a leakage current of the output driver 221$_i$ and prevent static power consumption from occurring.

On the other hand, when '0' and '0' or '1' and '1' are inputted as input signals D[1] and D[2], the equalizer control circuit 810$_2$ may output the voltage control signal $CTRV_2$ having the low level. Therefore, as shown in FIG. 11, the transistor MP2 may be turned on so that the power supply voltage $V_{DDL}$ may be outputted to the output node $N_{OUT}$. For example, when there is no data transition, the equalizer circuit 700$_i$ may output the pull-up signal $PU_i$ or the pull-down signal $PD_i$ to the output driver without boosting.

Next, a phase equalization operation of the equalizer circuit is described with reference to FIG. 8A, FIG. 8B, FIG. 12, FIG. 13, and FIG. 14. It is assumed in FIG. 12 and FIG. 13 that parallel input signals D[0], D[1], and D[2] inputted to a transmitter circuit (e.g., the transmitter circuit 110 of FIG. 1 or 200 of FIG. 2) are '0', '0' and '1', respectively.

Figure 12:
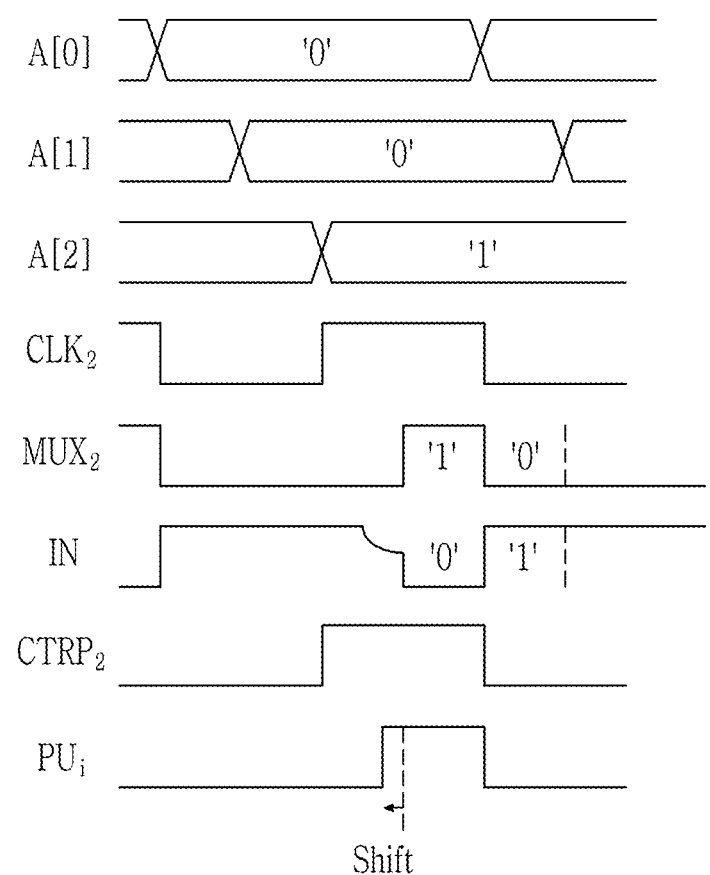
FIG. 12 is a timing diagram showing an example of signal timings in an equalizer circuit of a transmitter circuit according to an embodiment.
Figure 13:
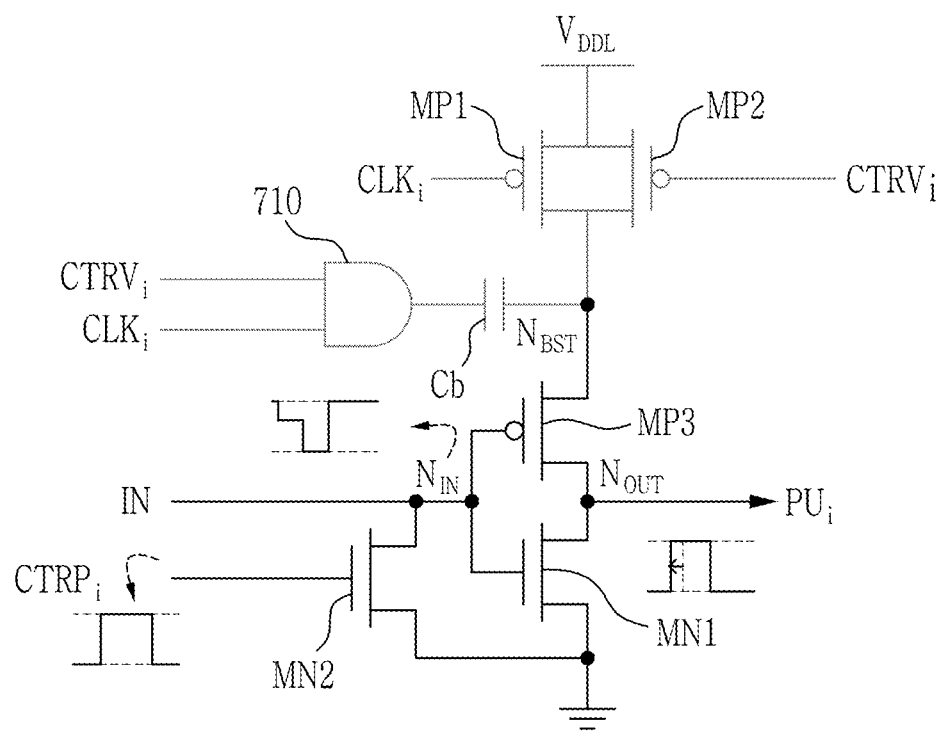
FIG. 13 is a circuit diagram showing an example case where an equalizer circuit performs phase equalization in a transmitter circuit according to an embodiment.
Figure 14:
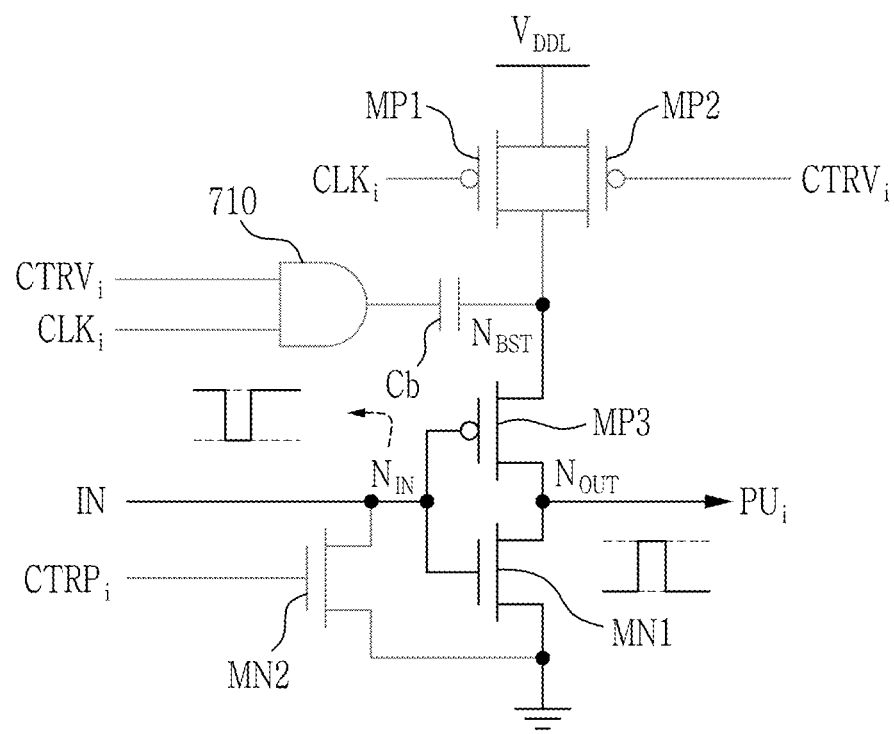
FIG. 14 is a circuit diagram showing an example case in which an equalizer circuit does not perform phase equalization in a transmitter circuit according to an embodiment.

FIG. 12 is a timing diagram showing an example of signal timings in an equalizer circuit of a transmitter circuit according to an embodiment, FIG. 13 is a circuit diagram showing an example case where an equalizer circuit performs phase equalization in a transmitter circuit according to an embodiment, and FIG. 14 is a circuit diagram showing an example case in which an equalizer circuit does not perform phase equalization in a transmitter circuit according to an embodiment.

Referring to FIG. 8A and FIG. 12, in an equalizer control circuit 810$_2$ corresponding to the input signal D[2], a logic circuit 811$_2$ may output a voltage control signal $CTRV_2$ having a high level based on a complementary bit value '0' of a delayed signal A[2] and a bit value '0' of a delayed signal A[1]. In addition, a logic circuit 812$_2$ may output a phase control signal $CTRP_2$ having the high level based on a bit value '1' of the voltage control signal $CTRV_2$ and a complementary bit value '1' of a delayed signal A[0].

Referring to FIG. 12 and FIG. 13, during 1 UI from a rising edge of the clock $CLK_2$, an overlapped signal $MUX_2$ has a low level but the phase control signal $CTRP_2$ may have the high level. Then, the transistor MN2 may be turned on so that a voltage of the input signal IN of an input node $N_{IN}$ may be decreased from the high level. When a relatively small transistor is used as the transistor MN2, the voltage of the input signal IN may gradually drop to a certain level during 1 UI.

Then, before the overlapped signal $MUX_2$ becomes the high level, the transistor MP3 may be turned on by the voltage drop of the input node $N_{IN}$. After that, when the overlapped signal $MUX_2$ becomes the high level, the transistor MP3 may maintain the turned-on state. Accordingly, a point in time when a voltage of the pull-up signal $PU_i$ of an output node $N_{OUT}$ becomes the high level may be quickened. For example, a phase shift may occur in the voltage of pull-up signal $PU_i$ of the output node $N_{OUT}$ by the phase equalization.

The above-described equalizer circuit, when a second input signal before a first input signal and a third input signal before the second input signal have the same bit value, and the first input signal has a different bit value from the second input signal (e.g., when the input signals maintain '0' and then change to '1' like "001"), may perform the phase equalization through the phase shift. The phase-shifted voltage of pull-up signal $PU_i$ may be applied to a gate of a pull-up transistor (e.g., $MU_i$ in FIG. 3) of an output driver (e.g., 221$_i$ in FIG. 3), and the pull-up transistor $MU_i$ of the output driver 221$_i$ may be turned on in response to the phase-shifted voltage of pull-up signal $PU_i$ to output a voltage having the high level to an output node OUT. Therefore, a timing margin required for the change of the input signals in the output driver 221$_i$ may be increased through the phase shift. Further, when the input signals maintain '1' and then change to '0' like "110", an equalizer circuit connected to a pull-down transistor (e.g., $MD_i$ in FIG. 3) of the output driver 221$_i$ may output the phase-shifted voltage as a pull-down signal $PD_i$, and the pull-down transistor $MD_i$ of the output driver 221$_i$ may be turned on in response to the phase-shifted voltage as pull-down signal $PD_i$, and output a voltage having the low level on the output node OUT. Accordingly, when an idle state frequently occurs (when a predetermined bit value is continuously maintained) at data transmission, the ISI may be improved through the phase shift.

On the other hand, when the input signal continuously maintains '0' or '1' or has a pattern of "010" or "101", the equalizer control circuit 810$_2$ may output the phase control signal $CTRP_2$ having the low level. Therefore, as shown in FIG. 14, since the transistor MN1 is turned off, the phase shift may not occur in the voltage of the output node $N_{OUT}$.

Figure 15:
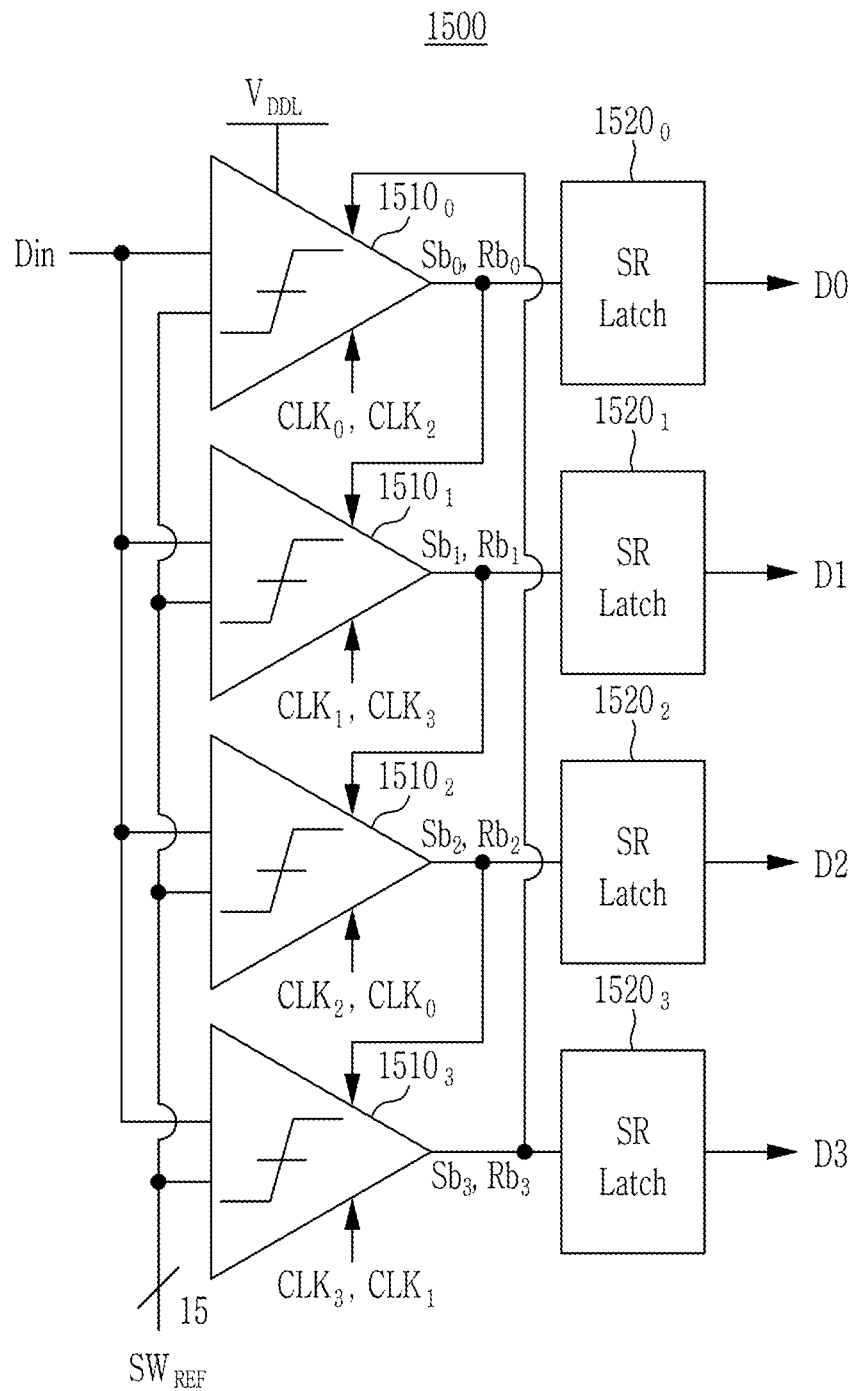
FIG. 15 is a block diagram showing an example of a receiver circuit according to an embodiment.
Figure 16:
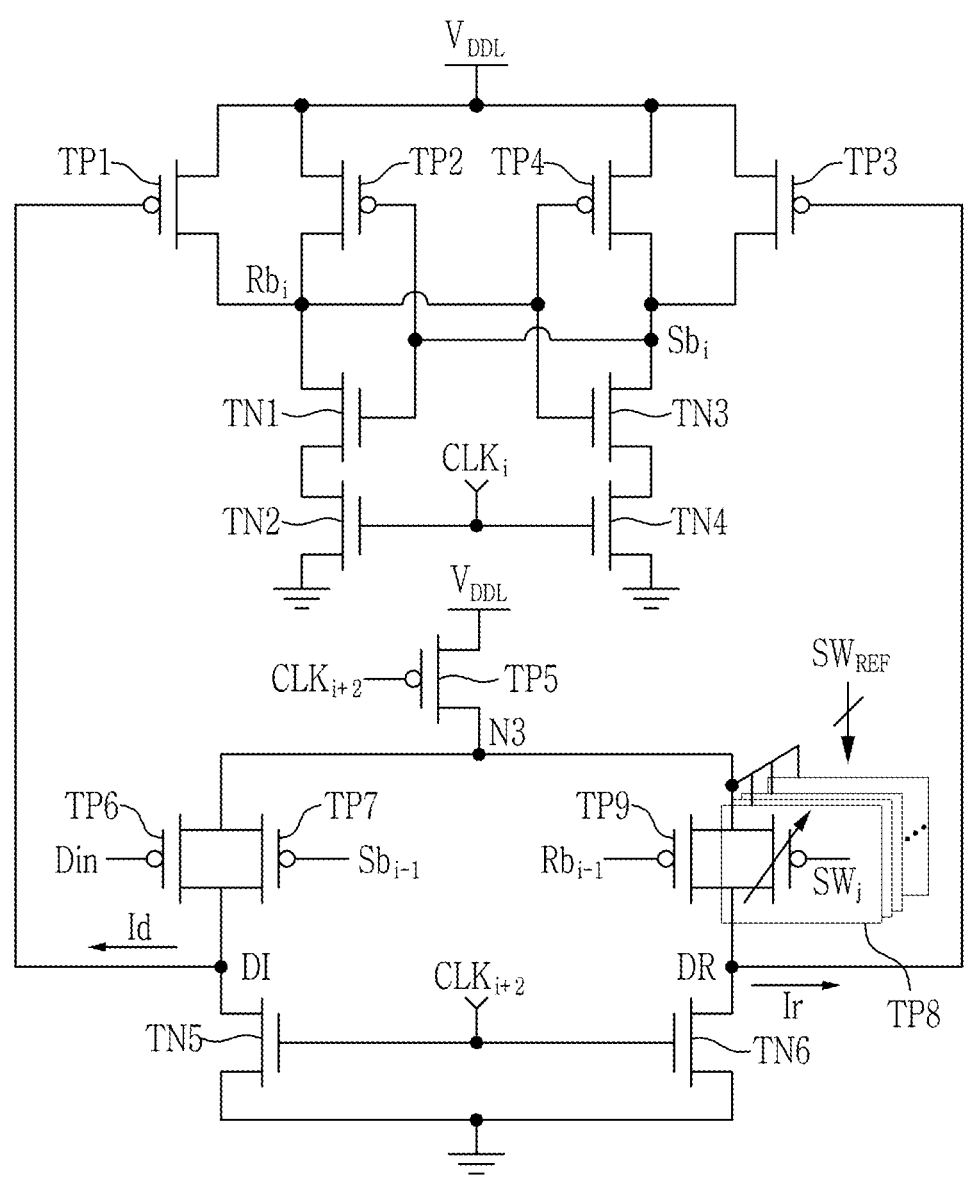
FIG. 16 is a circuit diagram showing an example of a comparator in a receiver circuit according to an embodiment.
Figure 17:
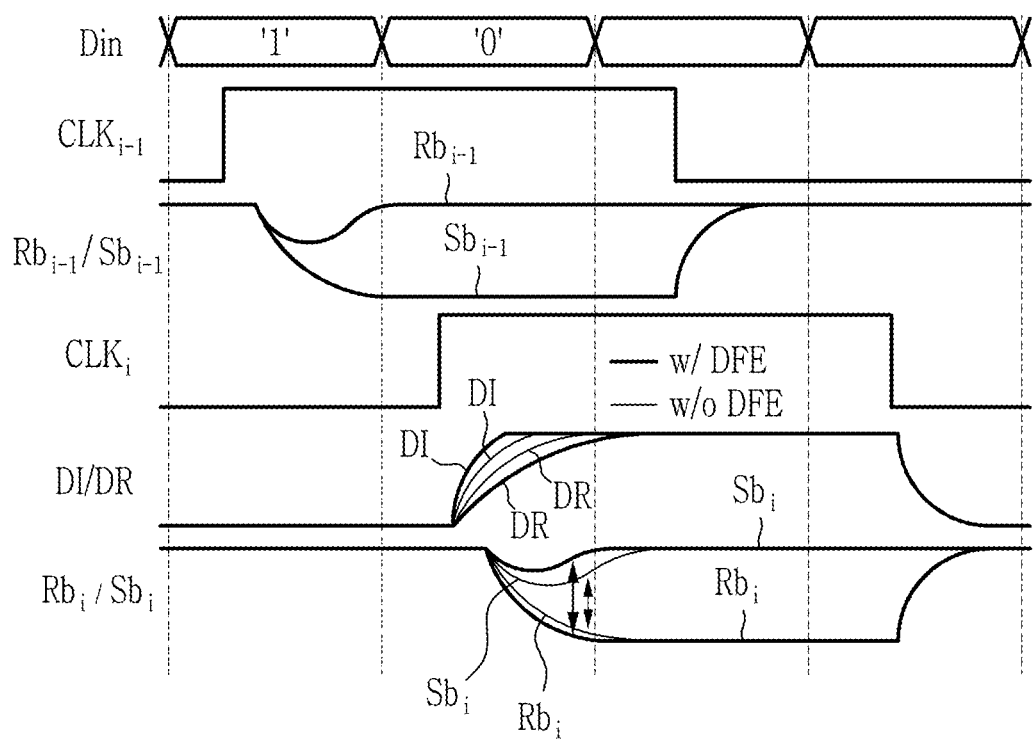
FIG. 17 is a timing diagram showing an example of signal timings in a receiver circuit according to an embodiment.

FIG. 15 is a block diagram showing an example of a receiver circuit according to an embodiment, FIG. 16 is a circuit diagram showing an example of a comparator in a receiver circuit according to an embodiment, and FIG. 17 is a timing diagram showing an example of signal timings in a receiver circuit according to an embodiment.

Referring to FIG. 15, a receiver circuit 1500 may receive, as an input signal Din, a transmission signal into which a plurality of bits are serialized from a transmitter circuit (e.g., 110 in FIG. 1). Herein, the receiver circuit 1500 may correspond to receiver circuit 120 of FIG. 1. The input signal Din may be, for example, a signal including 4 bits. The receiver circuit 1500 may include a plurality of comparators ($1510_0$, $1510_1$, $1510_2$, and $1510_3$), and a plurality of latches $1520_0$, $1520_1$, $1520_2$, and $1520_3$ respectively corresponding to the plurality of comparators $1510_0$, $1510_1$, $1510_2$, and $1510_3$. The comparators $1510_0$-$1510_3$ may correspond to a plurality of clocks, respectively. When using four clocks $CLK_0$, $CLK_1$, $CLK_2$, and $CLK_3$ whose phase is shifted by 90° as described above, the four comparators $1510_0$-$1510_3$ that operate in response to the four clocks $CLK_0$-$CLK_3$, respectively, may be provided. Each comparator $1510_i$ may decide a bit value of the input signal Din by comparing the input signal Din with a reference signal $SW_{REF}$ in response to an active edge (e.g., a rising edge) of a corresponding clock $CLK_i$. Accordingly, the plurality of comparators 1510i may sequentially decide bit values of the serially-inputted input signal Din. For example, after the comparator $1510_i$ decides one bit of the input signal Din in response to the active edge of the clock $CLK_i$, the comparator $1510_{i+1}$ may decide a next bit value of the input signal Din in response to the active edge of the clock $CLK_{i+1}$. The plurality of latches $1520_0$-$1520_3$ may store the four bit values (4-bit) D0, D1, D2, and D3 decided by the comparators $1510_0$-$1510_3$, respectively, and then output the stored bit values D0, D1, D2, and D3 in parallel.

Each comparator $1510_i$ may receive the input signal Din, the corresponding clock $CLK_i$, and an output of a previous comparator $1510_{i-1}$. Further, an output of the comparator $1510_i$ may be inputted to a next comparator $1510_{i+1}$. In this way, the comparator $1510_i$ may perform decision feedback equalization (DFE) that feeds back a previously-decided input signal Din, i.e., a previous bit value to perform a decision. For example, each comparator $1510_i$ may decide the bit value of the input signal Din based on the input signal Din, the reference signal $SW_{REF}$, and the output of the previous comparator $1510_{i-1}$, in response to the active edge of the corresponding clock $CLK_i$. The previous comparator $1510_{i-1}$ of the comparator $1510_i$ may indicate a comparator corresponding to the clock $CLK_{i-1}$ having a phase shift of 270° from the clock $CLK_i$ corresponding to the comparator $1510_i$, and the next comparator $1510_{i+1}$ of the comparator $1510_i$ may indicate a comparator corresponding to the clock $CLK_{i+1}$ having a phase shift of 90° from the clock $CLK_i$ corresponding to the comparator $1510_i$. The output of each comparator $1510_i$ may include a set signal (or a first control signal) $Sb_i$ and a reset signal (or a second control signal) $Rb_i$, and the set signal $Sb_i$ and the reset signal $Rb_i$ may be inputted to a set terminal and a reset terminal of the corresponding latches $1520_i$, respectively. In some embodiments, the latch may be a latch that maintains outputs in a constant state when both the set terminal and the reset terminal have '1' (a high level), for example, an SR NAND latch.

In some embodiments, each comparator $1510_i$ may further receive the clock $CLK_{i+2}$ having an opposite phase (i.e., a phase shift of 180°) with the clock $CLK_i$. Each comparator $1510_i$ may decide the bit value of the input signal Din based on the input signal Din, the reference signal $SW_{REF}$, and the output of the previous comparator $1510_{i-1}$, in responds to the active edge of the clock $CLK_i$ and an inactive edge (e.g., a falling edge) of the clock $CLK_{i+2}$. In some embodiments, the clock $CLK_{i+2}$ may be any one of the clocks $CLK_0$-$CLK_3$ or a clock obtained by inverting the clock $CLK_i$ through an inverter.

Each comparator $1510_i$ may output the set signal $Sb_i$ and the reset signal $Rb_i$ corresponding to a value of the input signal Din in response to the active edge (e.g., the rising edge) of the corresponding clock $CLK_i$. In some embodiments, each comparator $1510_i$ may output the set signal $Sb_i$ having '0' and the reset signal $Rb_i$ having '1' when the input signal Din has '1' at an active level (e.g., a high level) of the corresponding clock $CLK_i$, and output the set signal $Sb_i$ having '1' and the reset signal $Rb_i$ having '0' when the input signal Din has '0' at the active level of the corresponding clock $CLK_i$.

Next, each comparator $1510_i$ may output the set signal Sbi and the reset signal $Rb_i$ having the same value in response to the inactive edge (e.g., the falling edge) of the corresponding clock $CLK_i$. In some embodiments, each comparator $1510_i$ may output the set signal $Sb_i$ and the reset signal Rbi having '1' during a period in which the corresponding clock $CLK_i$ has an inactive level (e.g., a low level).

Each latch $1520_i$ may store the output of the corresponding comparator $1510_i$ and then output the stored output as a final input signal. In some embodiments, the latch $1520_i$ may be an SR latch. Each latch $1520_i$ may set an output value Di to '1' when the set signal $Sb_i$ and the reset signal $Rb_i$ have '0' and '1', respectively, set the output value Di to '0' when the set signal $Sb_i$ and the reset signal $Rb_i$ have '1' and '0', respectively, and maintain the output value Di when both the set signal $Sb_i$ and the reset signal $Rb_i$ have '1'.

In some embodiments, an additional circuit (not shown) may receive the bit values D0, D1, D2, and D3 output from the receiver circuit 1500 in parallel in response to only one clock.

Referring to FIG. 16, each comparator $1510_i$ may include a plurality of transistors TP1-TP9 and TN1-TN6. In some embodiments, the transistors TP1-TP9 and TN1-TN6 may be MOS transistors. In some embodiments, the transistors TP1-TP9 may be P-channel transistors, e.g., PMOS transistors, and the transistors TN1-TN6 may be N-channel transistors, e.g., NMOS transistors. The transistors TP1-TP9 and TN1-TN6 may each have a source, a drain, and a gate as a first input terminal, a second input terminal, and a control terminal.

The transistors TP1 and TP2 may be connected in parallel between a power source $V_{DDL}$ and a reset node $Rb_i$ (or a first output node) to which a reset signal $Rb_i$ is outputted. Herein, for convenience of description, the terms of the power supply $V_{DDL}$, the power supply voltage $V_{DDL}$ and the power source $V_{DDL}$ may be used interchangeably. Herein, for convenience of description, the terms of the reset node $Rb_i$ and the reset signal $Rb_i$ may be used interchangeably. For example, the sources of the transistors TP1 and TP2 may be connected to the power supply $V_{DDL}$, and the drains of the transistors TP1 and TP2 may be connected to the reset node $Rb_i$. The transistors TP3 and TP4 may be connected in parallel between the power source $V_{DDL}$ and a set node $Sb_i$ (or a second output node) to which the set signal $Sb_i$ is outputted. Herein, for convenience of description, the terms of the set node $Sb_i$ and the set signal $Sb_i$ may be used interchangeably. For example, the sources of the transistors TP3 and TP4 may be connected to the power supply $V_{DDL}$, and the drains of the transistors TP3 and TP4 may be connected to the set node $Sb_i$. The transistors TN1 and TN2 may be connected in series between the reset node $Rb_i$ and the ground terminal, and the transistors TN3 and TN4 may be connected in series between the set node $Sb_i$ and the ground terminal. For example, the drain of the transistor TN1 may be connected to the reset node $Rb_i$, the source of the transistor TN2 may be connected to the ground terminal, and the source of the transistor TN1 and the drain of the transistor TN2 may be connected to each other. A node where the source of transistor TN1 and the drain of transistor TN2 are connected may be referred to as a first node. Further, the drain of the transistor TN3 may be connected to the set node $Sb_i$, the source of the transistor TN4 may be connected to the ground terminal, and the source of the transistor TN3 and the drain of the transistor TN4 may be connected to each other. A node where the source of transistor TN3 and the drain of transistor TN4 are connected may be referred to as a second node. The gate of transistor TP1 may be connected to an input node (or a first input node) DI, and the gate of transistor TP3 may be connected to a reference node (or a second input node) DR. The gate of the transistor TP2 and the gate of the transistor TN1 are connected to the set node $Sb_i$, and the transistors TP2 and TN1 may form an inverter (or a first inverter). In this case, the gates of the transistors TP2 and TN1 may correspond to an input terminal of the first inverter, and the drains of the transistors TP2 and TN1 may correspond to an output terminal of the first inverter. The gate of the transistor TP4 and the gate of the transistor TN3 may be connected to the reset node $Rb_i$, and the transistors TP4 and TN3 may form an inverter (or a second inverter). In this case, the gates of transistors TP4 and TN3 may correspond to an input terminal of the second inverter, and the drains of transistors TP4 and TN3 may correspond to an output terminal of the second inverter. The clock $CLK_i$ corresponding to the comparator $1510_i$ may be inputted to the gate of the transistor TN2 and the gate of the transistor TN4.

The transistor TP5 may be connected between the power supply $V_{DDL}$ and a third node N3, and may be turned on in response to an active level of the clock $CLK_i$. In some embodiments, when the transistor TP5 is the PMOS transistor, and a clock $CLK_{i+2}$ having a phase shift of 180° from the clock $CLK_i$ may be inputted to the gate of the transistor TP5. For example, the source of the transistor TP5 may be connected to the power supply $V_{DDL}$, and the drain of the transistor TP5 may be connected to the third node N3. The transistors TP6 and TP7 may be connected in parallel between the third node N3 and the input node DI. For example, the sources of the transistors TP6 and TP7 may be connected to the third node N3, and the drains of the transistors TP6 and TP7 may be connected to the input node DI. An input signal Din may be inputted to the gate of the transistor TP6, and a voltage (a set signal) $Sb_{i-1}$ of a set node of a previous comparator $1510_{i-1}$ may be applied to the gate of the transistor TP7. For example, the gate of the transistor TP7 may be connected to the set node $Sb_{i-1}$ of the previous comparator $1510_{i-1}$. The previous comparator $1510_{i-1}$ of the comparator $1510_i$ may indicate a comparator corresponding to the clock $CLK_{i-1}$ having a phase shift of 270° from the clock $CLK_i$ corresponding to the comparator $1510_i$. The transistors TP8 and TP9 may be connected in parallel between the third node N3 and the reference node DR. For example, the sources of the transistors TP8 and TP9 may be connected to the third node N3, and the drains of the transistors TP8 and TP9 may be connected to the reference node DR. The reference signal $SW_{REF}$ may be inputted to the gate of the transistor TP8, and a voltage (a reset signal) $Rb_{i-1}$ of a reset node of the previous comparator $1510_{i-1}$ may be applied to the gate of the transistor TP9. For example, the gate of the transistor TP9 may be connected to the reset node $Rb_{i-1}$ of the previous comparator $1510_{i-1}$. The transistor TN5 may be connected between the input node DI and the ground terminal, and the transistor TN6 may be connected between the reference node DR and the ground terminal. For example, the drain of the transistor TN5 may be connected to the input node DI, and the source of the transistor TN5 may be connected to the ground terminal. Further, the drain of the transistor TN6 may be connected to the reference node DR, and the source of the transistor TN6 may be connected to the ground terminal. The transistors TN5 and TN6 may be turned off in response to the active level of the clock $CLK_i$. In some embodiments, when the transistors TN5 and TN6 are the NMOS transistors, the clock $CLK_{i+2}$ may be inputted to the gates of the transistors TN5 and TN6.

Figure 18:
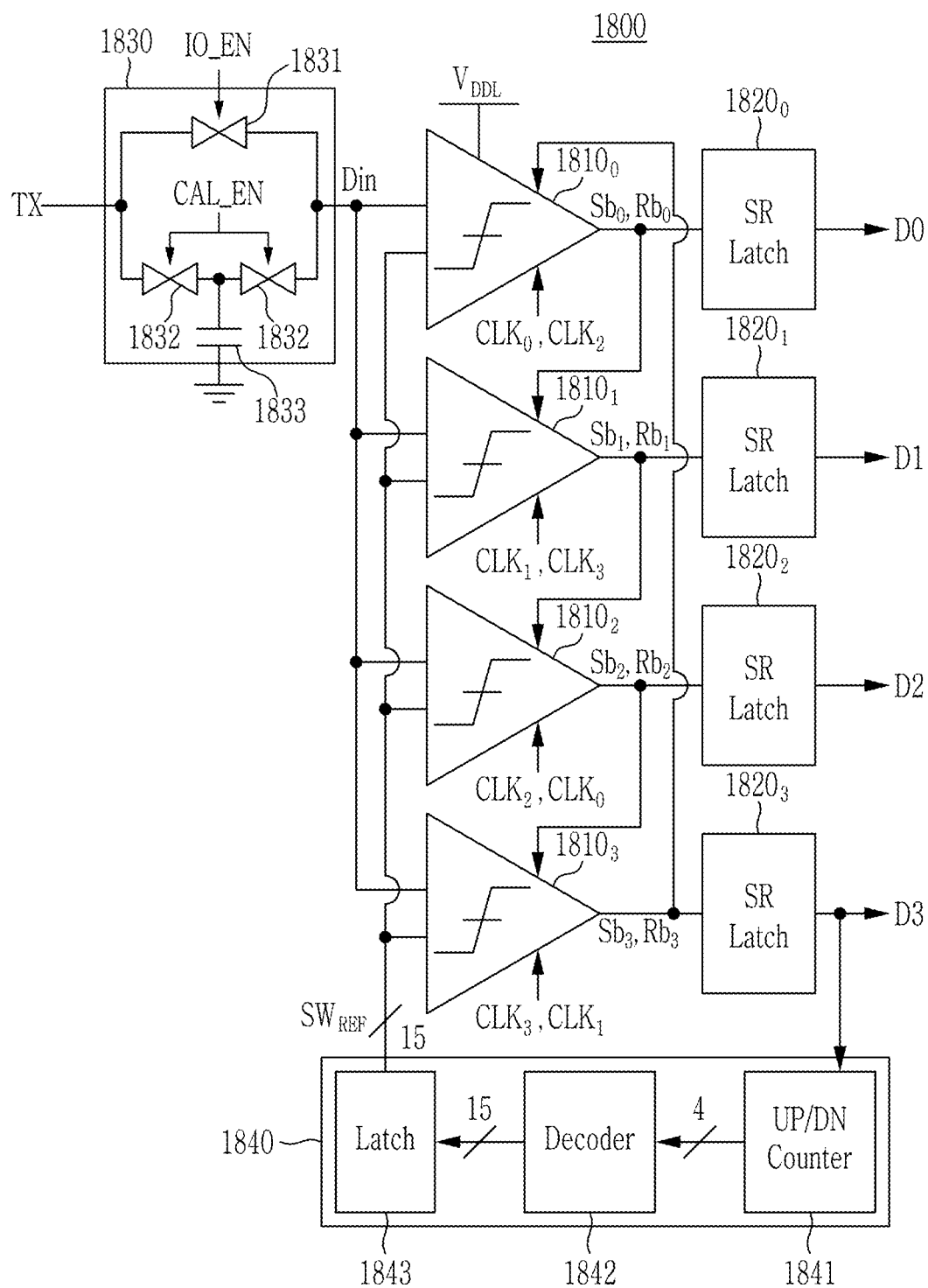
FIG. 18 is a circuit diagram showing an example of a receiver circuit according to an embodiment.

In some embodiments, the transistor TP8 to which the reference signal $SW_{REF}$ is inputted may include a plurality of parallel transistors TP8, and the reference signal $SW_{REF}$ may include a plurality of reference bits, for example, 15 reference bits $SW_1$-$SW_{15}$. In the parallel transistors TP8, the gate of each transistor TP8 may receive a corresponding reference bit $SW_j$ among the reference bits $SW_1$-$SW_{15}$. Here, j is an integer between 1 to 15. Accordingly, the transistors TP8 to which the reference bit having '0' among the reference bits $SW_1$-$SW_{15}$ are inputted may be turned on to determine a size of a current flowing through the transistors TP8. As such, generating the voltage of the reference node DR through the plurality of parallel transistors may reduce the static current consumption. In some embodiments, the number of reference bits having '0' among the reference bits $SW_1$-$SW_{15}$ may be decided when the receiving circuit 1500 performs a calibration operation in a calibration mode. When the receiving circuit 1500 performs a normal operation in a normal mode (e.g., an input/output (I/O) mode), one or more transistors TP8 may be turned on based on a result of the calibration operation. For example, the receiving circuit 1500 may be operated in the normal mode or the calibration mode by a mode selector as shown in FIG. 18.

Next, a case where the comparator $1510_i$ corresponding to the clock $CLK_i$ decides the input signal Din when the clock $CLK_i$ has an active level (e.g., a high level) is described with reference to FIG. 16 and FIG. 17. In this case, it is assumed that '1' has been inputted as the previous input signal Din and '0' is inputted as the current input signal Din. Since the previous input signal Din is '1', the reset signal $Rb_{i-1}$ of the comparator $1510_{i-1}$ corresponding to the clock $CLK_{i-1}$ may have the high level, and the set signal $Sb_{i-1}$ of the comparator $1510_{i-1}$ may have a low level. Before an active edge (e.g., a rising edge) of the clock $CLK_i$, the clock $CLK_{i+2}$ may have the high level, so that the transistors TN5 and TN6 may be turned on in response to the high level of the clock $CLK_{i+2}$ (or the low level of the clock $CLK_i$). The transistors TP1 and TP3 may be turned on by the turn-on of the transistors TN5 and TN6, and the reset signal $Rb_i$ and the set signal $Sb_i$ may have a power supply voltage $V_{DDL}$ (i.e., the high level). Further, when the clock $CLK_i$ becomes the high level, the clock $CLK_{i+2}$ may become the low level.

Accordingly, in response to the low level of the clock $CLK_{i+2}$ (or the high level of the clock $CLK_i$), the transistor TP5 may be turned on, and the transistors TN5 and TN6 may be turned off. A size of a current Id transferred from the power supply $V_{DDL}$ to the input node DI through the transistor TP6 may be determined according to a voltage of the input signal Din. For example, as the voltage of the input signal Din is lower, the size of the current Id transferred to the input node DI may increase. In addition, since the transistor TP7 is turned on by the set signal $Sb_{i-1}$ of the comparator $1510_{i-1}$, a current flowing through the transistor TP7 may be added to the current Id transferred to the input node DI. The transistor TP8 may transfer a current Ir having a size corresponding to the reference signal $SW_{REF}$ from the power supply $V_{DDL}$ to the reference node DR. For example, as the number of reference bits having '0' among the reference bits $SW_1$-$SW_{15}$ of the reference signal $SW_{REF}$ increases, the size of the current Ir transferred to the reference node DR may increase.

When the current Id of the input node DI is greater than the current Ir of the reference node DR, a speed at which the voltage of the input node DI increases to the power supply voltage $V_{DDL}$ may be faster than a speed at which the voltage of the reference node DR increases to the power supply voltage $V_{DDL}$. If the voltage of the input node DI increases quickly, the transistor TP1 may be turned off faster than the transistor TP3. When the transistor TP1 is turned off, the set signal $Sb_i$ may maintain the high level because the transistor TP3 is still turned on. Since both the set signal $Sb_i$ and the clock $CLK_i$ have the high level, the reset signal $Rb_i$ may decrease to a ground voltage (i.e., the low level) by turn-on of the transistors TN1 and TN2. As the reset signal $Rb_i$ decreases to the low level, the transistor TP4 may be turned on. Accordingly, the set signal $Sb_i$ may maintain the high level even when the transistor TP3 is turned off.

As such, when the input signal Din corresponds to '0', the current Id of the input node DI may be greater than the current Ir of the reference node DR. Accordingly, the comparator $1510_i$ may output the low level ('0') corresponding to the input signal Din ('0') at the reset node $Rb_i$, and output the high level ('1') corresponding to a complementary input signal Din ('1') at the set node $Sb_i$.

As shown in FIG. 17, by using the set signal $Sb_{i-1}$ and the reset signal $Rb_{i-1}$ decided in the previous comparator $1510_{i-1}$, that is, by using the DFE, the comparator $1510_i$ may control the voltage of the input node DI to increase faster and the voltage of the reference node DR slower compared with a case of using no DFE.

Therefore, a sensing margin in embodiments using the DFE may be larger than that in the case not using no DFE.

On the contrary, when the input signal Din is '1', the transistor TP6 may be turned off, so that the current Ir of the reference node DR may be greater than the current Id of the input node DI. Accordingly, the speed at which the voltage of the reference node DR increases up to the power voltage $V_{DDL}$ may be faster than the speed at which the voltage of the input node DI increases up to the power voltage $V_{DDL}$. If the voltage of the reference node DR increases quickly, the transistor TP3 may be turned off faster than the transistor TP1. Then, when the transistor TP3 is turned off, the reset signal $Rb_i$ may maintain the high level because the transistor TP1 is still turned on. Since both the reset signal $Rb_i$ and the clock $CLK_i$ have the high level, the set signal $Sb_i$ may decrease to the ground voltage (i.e., the low level) by turn-on of the transistors TN3 and TN4. As the set signal $Sb_i$ decreases to the low level, the transistor TP2 may be turned on. Accordingly, the reset signal $Rb_i$ may maintain the high level even when the transistor TP1 is turned off.

Accordingly, the comparator $1510_i$ may output the high level ('1') corresponding to the input signal Din ('1') at the reset node $Rb_i$, and output the low level ('0') corresponding to the complementary input signal Din at the set node $Sb_i$.

On the other hand, when '0' is inputted as the previous input signal Din and '1' is input as the current input signal Din, the reset signal $Rb_{i-1}$ of the comparator $1510_{i-1}$ may have the low level, and the set signal $Sb_{i-1}$ of the comparator $1510_{i-1}$ may have the high level. Accordingly, the transistor TP7 may be turned off and the transistor TP9 may be turned on, so that a current flowing through the transistor TP9 may be added to the current Ir transferred to the reference node DR by the reference signal $SW_{REF}$. As a result, the comparator $1510_i$ may control the voltage of the reference node DR to increase rapidly and the voltage of the input node DI to increase slowly. Accordingly, the comparator $1510_i$ may output the high level ('1') corresponding to the input signal Din ('1') at the reset node $Rb_i$, and output the low level ('0') corresponding to a complementary input signal Din ('0') at the set node $Sb_i$.

As described above, the comparator $1510_i$ may determine the current (or a first current) Id transferred to the input node DI in response to the input signal Din, and determine the current (or a second current) Ir transferred to the reference node DR in response to the reference signal $SW_{REF}$. Further, the comparator $1510_i$ may determine the current (or a third current) flowing through the transistor TP7 or the transistor TP9 in response to either the reset signal $Rb_{i-1}$ or the set signal $Sb_{i-1}$ of the previous comparator $1510_{i-1}$. The comparator $1510_i$ may decide the reset signal $Rb_i$ and the set signal $Sb_i$ based on a current obtained by adding the third current to any one of the first current Id and the second current Ir, and the other one.

FIG. 18 is a circuit diagram showing an example of a receiver circuit according to an embodiment.

Referring to FIG. 18, a receiver circuit 1800 may include a plurality of comparators $1810_0$, $1810_1$, $1810_2$, and $1810_3$, a plurality of latches $1820_0$, $1820_1$, $1820_2$, and $1820_3$, the mode selector 1830, and a reference bit generating circuit 1840.

The mode selector 1830 may include a plurality of switch 1831 and 1832 respectively corresponding to the I/O mode and the calibration mode, and a low pass filter 1833. The mode selector 1830 may turn on the I/O mode switch 1831 in response to an I/O mode enable signal IO_EN, and turn on the calibration mode switch 1832 in response to a calibration mode enable signal CAL_EN.

The reference bit generating circuit 1840 may include an up-down counter 1841, a decoder 1842, and a latch 1843. The up-down counter 1841 may increase or decrease a counter based on an output signal of one of the latches $1820_0$-$1820_3$, and may output a count signal according to the counter. The decoder 1842 decode the count signal to generate reference bits $SW_1$-$SW_{15}$. The latch 1843 may store the reference bits $SW_1$-$SW_{15}$, and transfer the reference bits $SW_1$-$SW_{15}$ to the comparators $1810_0$-$1810_3$ as a reference signal $SW_{REF}$.

When the I/O mode enable signal IO_EN is transmitted to the mode selector 1830, the mode selector 1830 may turn on the I/O mode switch 1831. The comparators $1810_0$-$1810_3$ and the latches $1820_0$-$1820_3$ may operate as described with reference to FIG. 15 to FIG. 17 based on the reference signal $SW_{REF}$ transferred from the reference bit generating circuit 1840.

When the calibration mode enable signal CAL_EN is transmitted to the mode selector 1830, the mode selector 1830 may turn on the calibration mode switch 1832. In the calibration mode, the output of one of the comparators $1810_0$-$1810_3$ (e.g., $1810_3$ may be used). In some embodiments, clocks $CLK_0$-$CLK_3$ supplied to the comparators $1810_0$-$1810_3$ in the calibration mode may be slower than clocks $CLK_0$-$CLK_3$ used in the I/O mode. For example, a frequency of the clocks $CLK_0$-$CLK_3$ used in the calibration mode may be 1/16 of a frequency of the clocks $CLK_0$-$CLK_3$ used in the I/O mode. A transmitter circuit (e.g., 110 in FIG. 1 or 200 in FIG. 2) may transmit a transmission signal TX for generating an intermediate voltage to be used in the calibration mode. The transmitter circuit 110 may transmit the transmission signal TX having, for example, "0011", "0101", "0110", "1001", "1010", or "1100" to generate the intermediate voltage of a swing level through the low pass filter 1833. The transmission signal TX may be converted to the approximately intermediate voltage through the low pass filter 1833, and the intermediate voltage may be transferred to the input signal Din of the comparator $1810_0$-$1810_3$. As described with reference to FIG. 15 to FIG. 17, the comparator $1810_0$-$1810_3$ may operate based on the input signal Din, the clocks $CLK_0$-$CLK_3$, and the reference bits $SW_1$-$SW_{15}$ stored in the latch 1843. Further, the latch $1820_3$ may store the output of the comparator $1810_3$ and then output the stored output.

For example, in the calibration mode, the transmitter circuit 110 or 200 may transmit "0011" as the transmission signal TX. The transmission signal TX may be transmitted as an input signal Din through the low-pass filter 1833. The transmission signal TX may be converted into the input signal Din having the intermediate voltage of the swing level through the low pass filter 1833. The comparator $1810_3$ may determine the number of transistors to be turned on among a plurality of transistors (e.g., TP8 in FIG. 16) based on the reference bits $SW_1$-$SW_{15}$ stored in the latch 1843. The comparator $1810_3$ may compare a current Id generated by the input signal Din with a current Ir generated by the reference bits $SW_1$-$SW_{15}$ to decide a reset signal $Rb_3$ and a set signal $Sb_3$. The latch $1820_3$ may output an output signal D3 decided based on the reset signal $Rb_3$ and the set signal $Sb_3$.

When the current Ir generated in the reference node DR by the reference bits $SW_1$-$SW_{15}$ is smaller than the current Id generated in the input node DI by the input signal Din, the output signal D3 may have '1'. The up-down counter 1841 may increase the counter in response to the output signal D3 having '1', and transfer the count signal to the decoder 1842. In some embodiments, the count signal may have 4 bits to correspond to 15 reference bits $SW_1$-$SW_{15}$. For example, the up-down counter 1841 may increase the counter from 7 to 8, and transfer the count signal of "1000" to the decoder 1842. The decoder 1842 may generate the reference bits $SW_1$-$SW_{15}$ by decoding the received count signal. The decoder 1842 may generate the reference bits $SW_1$-$SW_{15}$ to turn on the transistors TP8 by a number corresponding to a value of the count signal. For example, if the count signal is "1000", the decoder 1842 may set 8 reference bits $SW_1$-SWs among the reference bits $SW_1$-$SW_{15}$ to '1', and set the remaining reference bits $SW_9$-$SW_{15}$ to '0'. The latch 1843 may store the reference bits $SW_1$-$SW_{15}$ transferred from the decoder 1842, and transfer the stored reference bits $SW_1$-$SW_{15}$ to the comparators $1810_0$-$1810_3$.

When the current Ir generated in the reference node DR by the reference bits $SW_1$-$SW_{15}$ is greater than the current Id generated in the input node DI by the input signal Din, the output signal D3 may have '0'. The up-down counter 1841 may decrease the counter in response to the output signal D3 having '0', and transfer the count signal to the decoder 1842. The decoder 1842 may generate reference bits $SW_1$-$SW_{15}$ by decoding the received count signal. The latch 1843 may store the reference bits $SW_1$-$SW_{15}$ transferred from the decoder 1842, and transfer the stored reference bits $SW_1$-$SW_{15}$ to the comparators $1810_0$-$1810_3$.

By repeating this operation, the reference signal $SW_{REF}$ having the reference bits $SW_1$-$SW_{15}$ corresponding to the intermediate voltage of the swing level may be determined.

Figure 19:
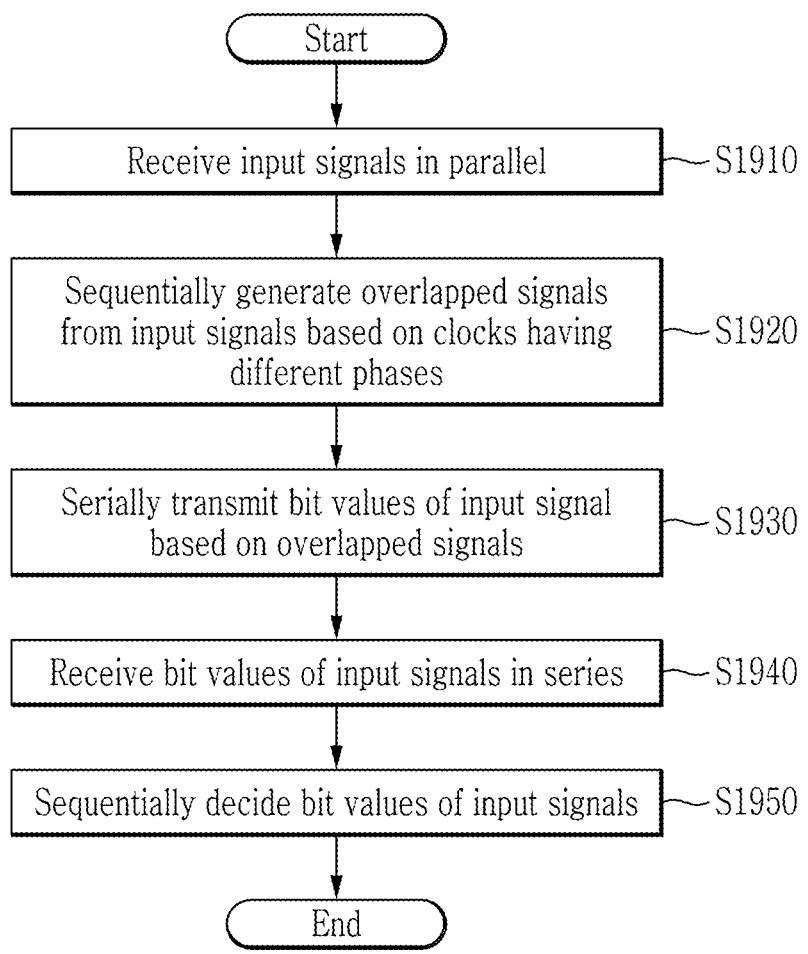
FIG. 19 is a flowchart showing an example of an operation method of an interface circuit according to an embodiment.

FIG. 19 is a flowchart showing an example of an operation method of an interface circuit according to an embodiment.

Referring to FIG. 19, a transmitter circuit of an interface circuit may receive a plurality of input signals in parallel at S1910. The transmitter circuit may sequentially generate a plurality of overlapped signals from the input signals based on a plurality of clocks having different phases at S1920. In this case, each overlapped signal may include bit values of two input signals among the input signals. The transmitter circuit may serially transmit the bit values of the input signal based on the overlapped signals at S1930. In some embodiments, the transmitter circuit may perform voltage equalization and phase equalization for each overlapped signal.

A receiver circuit of the interface circuit may receive the bit values of the input signals in series through a via at S1940. The receiver circuit may sequentially decide the bit values of the input signals based on a plurality of clocks having different phases at S1950. The receiver circuit may decide a bit value of a current input signal (or a first input signal) among the input signals based on a bit value of a previous input signal (or a second input signal) among the input signals and a clock corresponding to the current input signal among the clocks at S1950.

While this invention has been described in connection with what is presently considered to be practical embodiments, it will be understood that various changes in form and details may be made therein without departing from the spirit and scope of the appended claims.

What is claimed is:

1. An interface circuit comprising:
    a transmitter circuit configured to receive a plurality of input signals, and output bit values of the plurality of input signals based on the plurality of input signals,
    wherein the transmitter circuit comprises:
    a clock generating circuit configured to generate a plurality of clocks having different phases;
    a pulse generating circuit configured to generate a plurality of pulses based on the plurality of clocks;
    an overlapped multiplexing circuit configured to receive the plurality of input signals in parallel, and sequentially output a plurality of overlapped signals based on the plurality of clocks, the plurality of input signals, and the plurality of pulses, each of the plurality of overlapped signals comprising bit values of two input signals among the plurality of input signals; and
    an output circuit configured to output the bit values of the plurality of input signals in series based on the plurality of overlapped signals,
    wherein the output circuit is configured to output 1-bit value based on two overlapped signals among the plurality of overlapped signals.

2. The interface circuit of claim 1, wherein the overlapped multiplexing circuit comprises a plurality of delay circuits respectively corresponding to the plurality of input signals,
    wherein each of the plurality of delay circuits is configured to receive a corresponding input signal among the plurality of input signals, and output the corresponding input signal in response to an active edge of a corresponding clock among the plurality of clocks, and
    wherein the overlapped multiplexing circuit is further configured to sequentially output the plurality of overlapped signals based on the plurality of pulses and outputs of the plurality of delay circuits.

3. The interface circuit of claim 2, wherein the overlapped multiplexing circuit further comprises a plurality of first logic circuits and a plurality of second logic circuits, wherein each of the plurality of first logic circuits is configured to perform a logical operation on an output of a corresponding delay circuit among the plurality of delay circuits and a corresponding pulse among the plurality of pulses, and wherein each of the plurality of second logic circuits is configured to perform a logical operation on outputs of two first logic circuits among the plurality of first logic circuits, and to output a corresponding overlapped signal among the plurality of overlapped signals.

4. The interface circuit of claim 3, wherein each of the plurality of delay circuits comprises a flip-flop, wherein each of the plurality of first logic circuits comprises a NAND gate, and wherein each of the plurality of second logic circuits comprises a NAND gate.

5. The interface circuit of claim 1, wherein the output circuit comprises a plurality of output drivers respectively corresponding to the plurality of overlapped signals and connected to an output node in common, wherein each of the plurality of output driver comprises a pull-up transistor connected between a first power supply and the output node and a pull-down transistor connected between the output node and a ground terminal, and wherein one of the pull-up transistor and the pull-down transistor is configured to operate in response to a bit value of a corresponding overlapped signal among the plurality of overlapped signals, and another one of the pull-up transistor and the pull-down transistor is configured to operate in response to a complementary bit value of the corresponding overlapped signal.

6. The interface circuit of claim 5, wherein the overlapped multiplexing circuit is configured to be supplied a second power supply higher voltage than the first power supply.

7. The interface circuit of claim 5, wherein the output circuit is configured to output a bit value of one input signal among the plurality of input signals on the output node by operating two output drivers of the output circuit.

8. The interface circuit of claim 1, wherein the transmitter circuit further comprises:

a plurality of equalizer circuits configured to receive the plurality of overlapped signals, respectively, wherein the plurality of input signals includes a first input signal and a second input signal before the first input signal, and wherein when the first input signal and the second input signal have different bit values, an equalizer circuit corresponding to the first input signal among the plurality of equalizer circuits is configured to boost a voltage corresponding to a corresponding overlapped signal among the plurality of overlapped signals and transfer the boosted voltage to the output circuit.

9. The interface circuit of claim 8, wherein the plurality of input signals further include a third input signal before the second input signal, and wherein when the second input signal and the third input signal have the same bit value, and the first input signal and the second input signal have different bit values, the equalizer circuit corresponding to the first input signal is further configured to shift a phase of the corresponding overlapped signal and transfer the phase shifted voltage to the output circuit.

10. The interface circuit of claim 1, wherein the transmitter circuit further comprises:

an equalizer control circuit configured to output a first control signal and a second control signal based on the plurality of input signals; and an equalizer circuit connected between the overlapped multiplexing circuit and the output circuit and configured to operate in response to the first control signal and the second control signal.

11. The interface circuit of claim 10, wherein the overlapped multiplexing circuit comprises a plurality of delay circuits configured to sequentially delay the plurality of input signals, wherein the plurality of input signals include a first input signal, a second input signal before the first input signal, and a third input signal before the second input signal, wherein the plurality of delay circuits include a first delay circuit corresponding to the first input signal, a second delay circuit corresponding to the second input signal, and a third delay circuit corresponding to the third input signal, wherein an output of each of the plurality of delay circuits comprises a first delayed signal and a second delayed signal having a complementary bit value of the first delayed signal, and wherein the equalizer control circuit comprises:

a first logic circuit configured to perform a first logical operation on the first delayed signal outputted from the first delay circuit and the second delayed signal outputted from the second delay circuit and output the first control signal based on a result of the first logical operation; and a second logic circuit configured to perform a second logical operation on the first control signal and the first delayed signal outputted from the third delay circuit and output the second control signal based on a result of the second logical operation.

12. The interface circuit of claim 1, further comprising:
a receiver circuit connected to the transmitter circuit,
wherein the receiver circuit comprises:
a plurality of comparators configured to receive a plurality of bits as an input signal from the transmitter circuit, and each comparator configured to decide a bit value of a corresponding bit among the plurality of bits based on a corresponding clock among the plurality of clocks, and output the decided bit value; and a plurality of latches respectively connected to the plurality of comparators, and wherein a first comparator among the plurality of comparators is configured to decide the bit value of the corresponding bit based on a first clock among the plurality of clocks and an output of a second comparator among the plurality of comparators, and transfer the decided bit value to a third comparator among the plurality of comparators.

13. The interface circuit of claim 12, wherein the first comparator is further configured to decide the bit value of the corresponding bit based on the output of the second comparator, the input signal, and a reference signal in response to an active edge of the first clock.

14. The interface circuit of claim 13, wherein the first comparator is further configured to decide the bit value of the corresponding bit based on the output of the second comparator, the input signal, and the reference signal in response to the active edge of the first clock and an inactive edge of a second clock having an opposite phase with the first clock.

15. The interface circuit of claim 13, wherein an output of each of the plurality of comparators comprises a first control signal and a second control signal having a different level than the first control signal, and
wherein each of the plurality of latches is configured to operate in response to the first control signal and the second control signal of a corresponding comparator among the plurality of comparators.

16. The interface circuit of claim 15, wherein the first comparator is further configured to:
determine a first current in response to the input signal,
determine a second current in response to the reference signal,
determine a third current in response to any one of the first control signal and the second control signal that are outputted from the second comparator, and
decide voltage levels of the first control signal and the second control signal from the first comparator based on a current obtained by adding the third current to one of the first current and the second current, and another one of the first current and the second current.

17. The interface circuit of claim 15, wherein the first comparator comprises:
a first transistor connected between a power source and a first output node to which the first control signal is outputted, and including a gate connected to a first input node;
a second transistor connected between the power source and a second output node to which the second control signal is outputted, and including a gate connected to a second input node;
a first inverter connected between the power source and a first node, and comprising an input terminal connected to the second output node and an output terminal connected to the first output node;
a second inverter connected between the power source and a second node, and comprising an input terminal connected to the first output node and an output terminal connected to the second output node;
a third transistor connected between the first node and a ground terminal, and configured to be turned on in response to an active level of the first clock;
a fourth transistor connected between the second node and the ground terminal, and configured to be turned on in response to the active level of the first clock;
a fifth transistor connected between the power source and a third node, and configured to be turned on in response to the active level of the first clock;
a sixth transistor connected between the third node and the first input node, and configured to operate in response to the input signal;
a seventh transistor connected between the third node and the first input node, and configured to operate in response to the second control signal outputted from the second comparator;
an eighth transistor connected between the third node and the second input node, and configured to operate in response to the reference signal;
a ninth transistor connected between the third node and the second input node, and configured to operate in response to the first control signal outputted from the second comparator;
a tenth transistor connected between the first input node and the ground terminal, and configured to be turned off in response to the active level of the first clock; and
an eleventh transistor connected between the second input node and the ground terminal, and configured to be turned off in response to the active level of the first clock.

18. The interface circuit of claim 17, wherein the reference signal comprises a plurality of reference bits,
wherein the first comparator further includes a plurality of transistors connected in parallel and to the eighth transistor, and
wherein the plurality of reference bits are applied to gates of the plurality of transistors, respectively.

19. An operation method of an interface circuit, comprising:
generating a plurality of clocks having different phases;
generating a plurality of pulses based on the plurality of clocks;
receiving a plurality of input signals in parallel;
sequentially generating a plurality of overlapped signals from the plurality of input signals based on a plurality of first clocks having different phases of the plurality of clocks, and the plurality of pulses, each of the plurality of overlapped signals comprising bit values of two input signals among the plurality of input signals; and
transmitting bit values of the plurality of input signal in series based on the plurality of overlapped signals,
wherein the transmitting of the bit values includes transmitting 1-bit value based on two overlapped signals among the plurality of overlapped signals.

20. The operation method of claim 19, further comprising:
receiving bit values of the plurality of input signals; and
sequentially deciding the bit values of the plurality of input signals based on a plurality of second clocks having different phases of the plurality of clocks,
wherein the sequentially deciding of the bit values of the plurality of input signals comprises:
deciding a bit value of a first input signal among the plurality of input signals based on a bit value of a second input signal among the plurality of input signals and a second clock corresponding to the first input signal among the plurality of second clocks, and
wherein the second input signal is received before the first input signal.

* * * * *